(12) United States Patent
Lin et al.

(10) Patent No.: US 12,446,210 B2
(45) Date of Patent: Oct. 14, 2025

(54) MEMORY CELL AND METHOD

(71) Applicant: Taiwan Semiconductor Manufacturing Co., Ltd., Hsinchu (TW)

(72) Inventors: Meng-Han Lin, Hsinchu (TW); Han-Jong Chia, Hsinchu (TW); Sai-Hooi Yeong, Zhubei (TW); Chi On Chui, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 627 days.

(21) Appl. No.: 17/747,694

(22) Filed: May 18, 2022

(65) Prior Publication Data
US 2022/0285349 A1    Sep. 8, 2022

Related U.S. Application Data

(63) Continuation of application No. 16/901,885, filed on Jun. 15, 2020, now Pat. No. 11,342,334.

(51) Int. Cl.
*H10B 12/00* (2023.01)
*H10D 1/00* (2025.01)
*H10D 1/68* (2025.01)
*H10D 30/67* (2025.01)

(52) U.S. Cl.
CPC ........... *H10B 12/33* (2023.02); *H10B 12/036* (2023.02); *H10B 12/05* (2023.02); *H10D 1/042* (2025.01); *H10D 1/714* (2025.01); *H10D 30/6735* (2025.01)

(58) Field of Classification Search
CPC ..... B82Y 10/00; H01L 28/87; H01L 29/0665; H01L 29/0673; H01L 29/42356; H01L 29/42392; H01L 29/66439; H01L 29/775; H01L 29/78696; H10B 12/033; H10B 12/036; H10B 12/05; H10B 12/31; H10B 12/33; H10D 1/042; H10D 1/714; H10D 30/014; H10D 30/43; H10D 30/6735; H10D 30/6757; H10D 62/118; H10D 62/121; H10D 64/512
See application file for complete search history.

(56) References Cited

U.S. PATENT DOCUMENTS

| | | | | |
|---|---|---|---|---|
| 6,069,819 | A * | 5/2000 | Tiwari | H10B 12/05 257/E21.654 |
| 6,201,278 | B1 * | 3/2001 | Gardner | H01L 29/7834 257/E29.267 |
| 9,209,247 | B2 | 12/2015 | Colinge et al. | |

(Continued)

*Primary Examiner* — Britt D Hanley
*Assistant Examiner* — Kevin Quinto
(74) *Attorney, Agent, or Firm* — Slater Matsil, LLP

(57) ABSTRACT

An improved memory cell architecture including a nanostructure field-effect transistor (nano-FET) and a horizontal capacitor extending at least partially under the nano-FET and methods of forming the same are disclosed. In an embodiment, semiconductor device includes a channel structure over a semiconductor substrate; a gate structure encircling the channel structure; a first source/drain region adjacent the gate structure; and a capacitor adjacent the first source/drain region, the capacitor extending under the first source/drain region and the gate structure in a cross-sectional view.

20 Claims, 29 Drawing Sheets

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2001/0008289 | A1 | 7/2001 | Hahn |
| 2009/0096003 | A1 | 4/2009 | Zhu |
| 2013/0330891 | A1 | 12/2013 | Chang et al. |

* cited by examiner

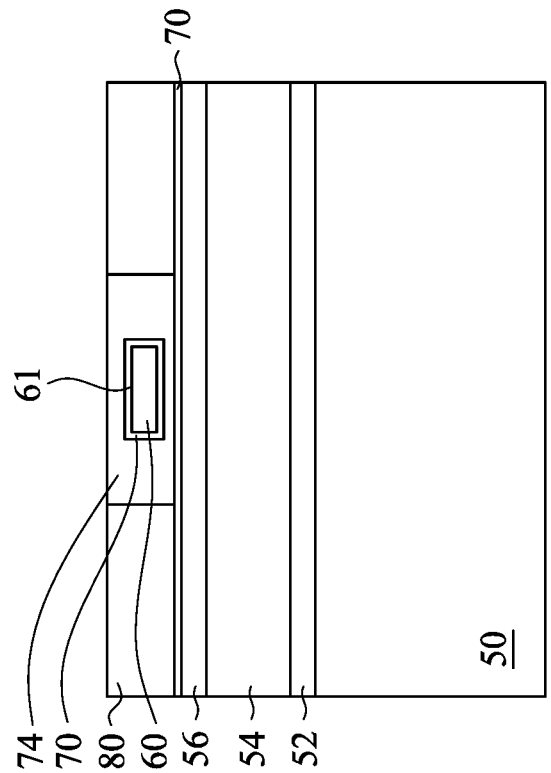
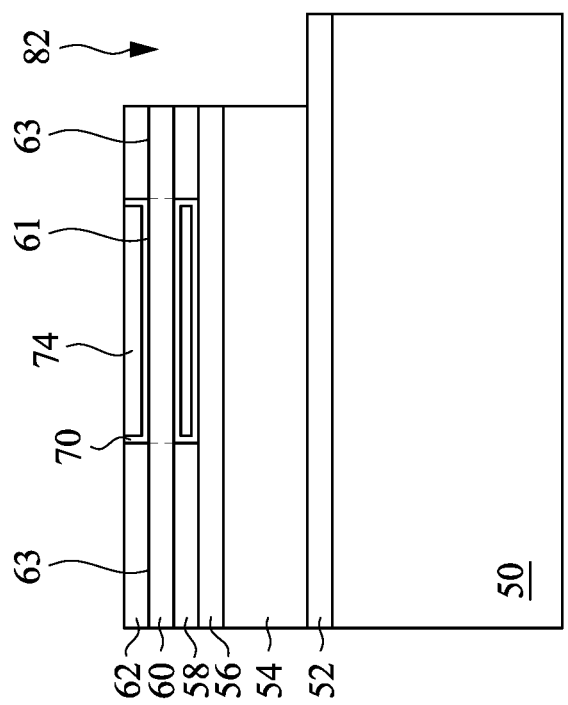
Figure 9A
Figure 9B

MEMORY CELL AND METHOD

PRIORITY CLAIM AND CROSS-REFERENCE

This application is a continuation of U.S. patent application Ser. No. 16/901,885, now U.S. Pat. No. 11,342,334, issued May 24, 2022, entitled "Memory Cell and Method," filed on Jun. 15, 2020, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D, 3A-3D, 4A-4D, 5A-5D, 6A-6E, 7A-7D, 8A-8D, 9A-9D, 10A-10D, 11A-11D, 12A-12D, and 13A-13D are cross-sectional views of intermediate steps in the manufacturing of semiconductor devices, in accordance with some embodiments.

DETAILED DESCRIPTION

Figure 1:
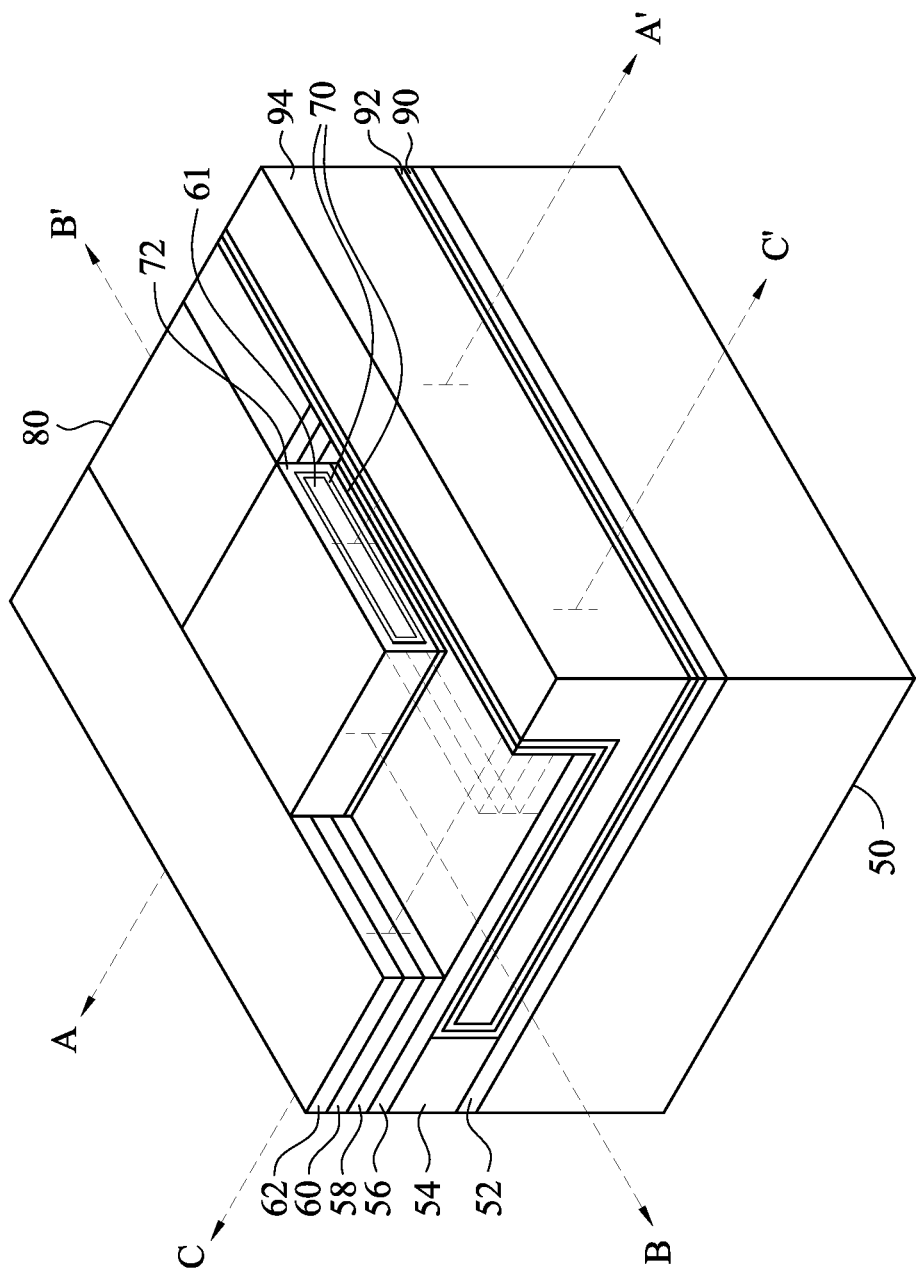
FIG. 1 illustrates an example of a memory cell including a nanostructure field-effect transistor (nano-FET) and a horizontal capacitor in a three-dimensional view, in accordance with some embodiments.
Figure 2B:
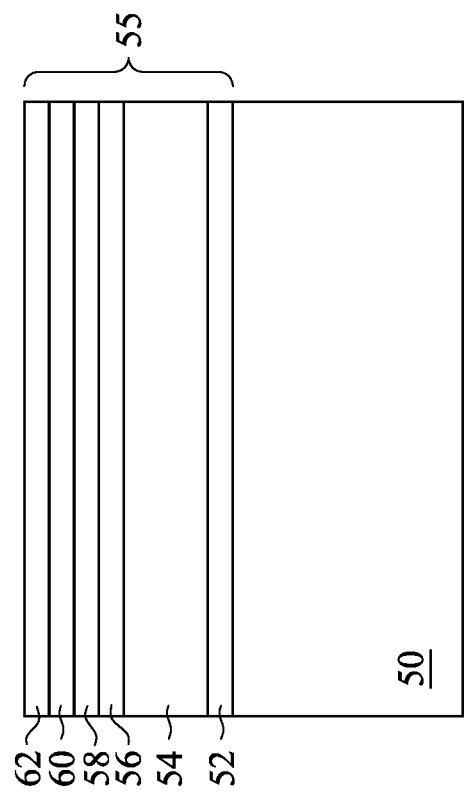
Figure 2A:
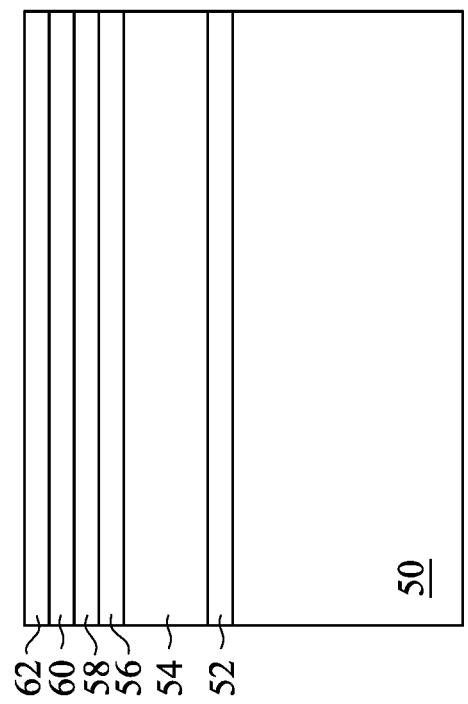
Figure 2D:
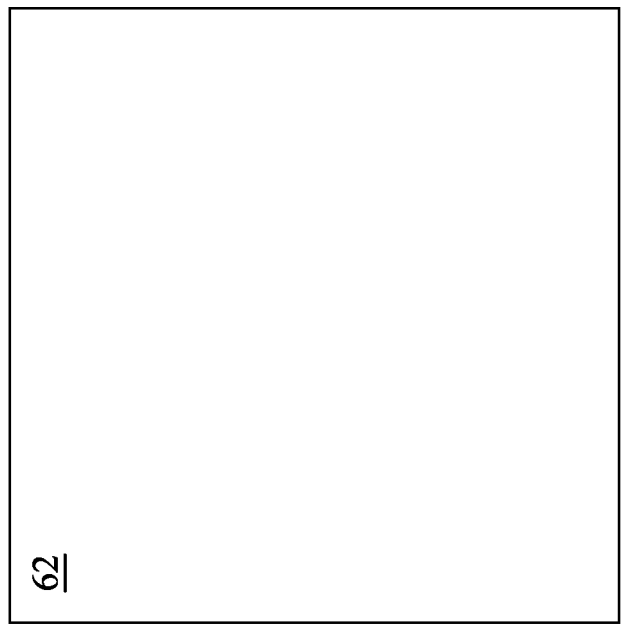
Figure 2C:
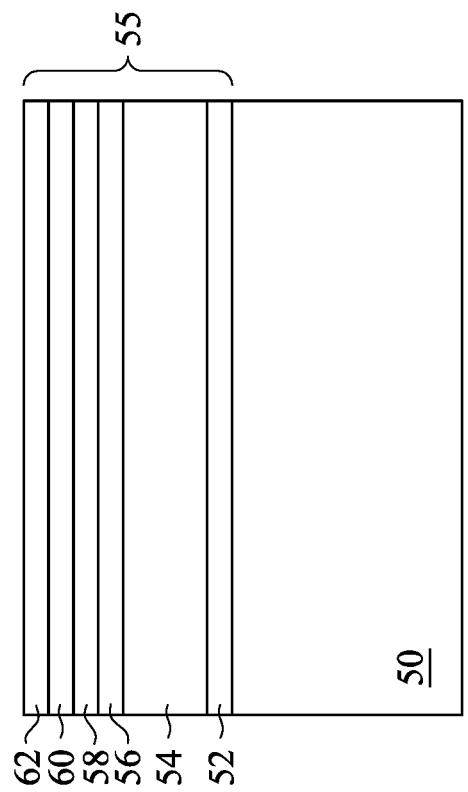

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide memory cells having improved architectures and methods of forming the same. In some embodiments, the memory cells may include dynamic random access memory (DRAM) cells. The memory cells may be single-transistor, single-capacitor memory cells. In some embodiments, the memory cells may include a nano-FET (e.g., a nanowire FET, a nanosheet FET, or the like) and a horizontal capacitor which extends at least partially under the nano-FET. Top surfaces of the nano-FET and the horizontal capacitor may be coplanar with one another. In some embodiments, the method includes forming the nano-FET over a semiconductor substrate, etching a source/drain region of the nano-FET and various dielectric layers underlying the nano-FET to form an opening extending at least partially under the nano-FET, and depositing the horizontal capacitor in the opening using ALD, CVD, or the like. The horizontal capacitor may be L-shaped or a comb-shaped in a cross-sectional view. Including a nano-FET and a horizontal capacitor extending at least partially under the nano-FET in a memory cell allows for memory cell to be formed in a small area, while the volume of the capacitor is increased. Increasing capacitor volume allows for read reliability to be increased and improves device performance. Forming the memory cell in a smaller area allows for device density to be increased. Moreover, the nano-FET and horizontal capacitor may be formed by conventional complementary metal-oxide-semiconductor (CMOS) processes, which provides easy integration and lowers cost. Thus, memory cells may be formed with reduced area, reduced cost, and increased performance.

FIG. 1 illustrates an example memory cell, in accordance with some embodiments. The memory cell includes a nanostructure (e.g., nanosheet, nanowire, gate-all-around, or the like) field-effect transistor at least partially over a horizontal capacitor, both of which are over a substrate 50 (e.g., a semiconductor substrate). The nano-FET includes a nanostructure 61 (e.g., a nanowire, a nanosheet, or the like) over the substrate 50. The nanostructure 61 may be formed in a semiconductor layer 60 and may act as a channel region for the nano-FET. The nanostructure 61 may be a p-type nanostructure or an n-type nanostructure. The nano-FET further includes gate dielectric layers 70 along top surfaces, sidewalls, and bottom surfaces of the nanostructure 61. A gate electrode 74 is over the gate dielectric layers 70. Source/drain regions 63 are formed in the semiconductor layer 60 on opposing sides of the gate dielectric layers 70 and the gate electrode 74. A first metal layer 62 is over the source/drain regions 63 of the semiconductor layer 60 and is a contact to the source/drain regions 63. A fourth dielectric layer 58 isolates portions of the nano-FET from the horizontal capacitor and other underlying structures. A first interlayer dielectric (ILD) 80 is formed adjacent the gate electrode 74.

The nano-FET is formed over a first dielectric layer 52, a second dielectric layer 54, and a third dielectric layer 56.

The horizontal capacitor may include a second metal layer 90 along top surfaces of the first dielectric layer 52, sidewalls of the second dielectric layer 54, the third dielectric layer 56, the fourth dielectric layer 58, the semiconductor layer 60, and the first metal layer 62 and bottom surfaces of the third dielectric layer 56. The horizontal capacitor further includes a fifth dielectric layer 92 over the second metal layer 90 and a third metal layer over the fifth dielectric layer 92. The horizontal capacitor may be a metal-insulator-metal capacitor. As illustrated in FIG. 1, the horizontal capacitor may be L-shaped in a cross-sectional view and may extend underneath the nano-FET. The first dielectric layer 52 may isolate the horizontal capacitor from the substrate 50. The third dielectric layer 56 may isolate portions of the horizontal capacitor from the nano-FET. The second dielectric layer 54 may be a sacrificial layer, which is replaced by the horizontal capacitor.

FIG. 1 further illustrates reference cross-sections that are used in later figures. Cross-section A-A' is along a longitudinal axis of the nanostructure 61 and in a direction of current flow between the source/drain regions 63 of the nano-FET. Cross-section B-B' is perpendicular to cross-section A-A', is along a longitudinal axis of the gate electrode, and in a direction perpendicular to the direction of the current flow between the source/drain regions 63 of the nano-FET. Cross-section C-C' is parallel to cross-section A-A' and extends through the first ILD 80. Subsequent figures refer to these reference cross-sections for clarity.

Some embodiments discussed herein are discussed in the context of nano-FETs. The nano-FETs may be formed using gate-first or gate-last processes. Also, some embodiments contemplate aspects used fin field effect transistors (FinFETs) or planar devices, such as planar FETs.

FIGS. 2A through 13D are cross-sectional views and top-down views of intermediate stages in the manufacturing of memory cells, in accordance with some embodiments. FIGS. 2A, 3A, 4A, 5A, 6A, 7A, 8A, 9A, 10A, 11A, 12A, and 13A illustrate reference cross-section A-A' illustrated in FIG. 1. FIGS. 2B, 3B, 4B, 5B, 6B, 7B, 8B, 9B, 10B, 11B, 12B, and 13B illustrate reference cross-section B-B' illustrated in FIG. 1. FIGS. 2C, 3C, 4C, 5C, 6C, 7C, 8C, 9C, 10C, 11C, 12C, and 13C illustrate reference cross-section C-C' illustrated in FIG. 1. FIGS. 2D, 3D, 4D, 5D, 6D, 7D, 8D, 9D, 10D, 11D, 12D, and 13D illustrate top-down views.

In FIGS. 2A through 2D, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, the substrate 50 may include a region for forming n-type devices and a region for forming p-type devices (not separately illustrated). The region for forming n-type devices may be physically separated from the region for forming p-type devices and any number of devices features (e.g., other active devices, doped regions, isolation structures, etc.) may be disposed between the region for forming n-type devices and the region for forming p-type devices. Appropriate wells may be formed in the region for forming n-type devices and the region for forming p-type devices of the substrate 50. In some embodiments, P wells may be formed in the region for forming n-type devices, and N wells may be formed in the region for forming p-type devices. In some embodiments, P wells or N wells may be formed in each of the region for forming n-type devices and the region for forming p-type devices.

Further in FIGS. 2A through 2D, a multi-layer stack 55 is formed over the substrate 50. The multi-layer stack 55 may include a first dielectric layer 52, a second dielectric layer 54, a third dielectric layer 56, a fourth dielectric layer 58, a semiconductor layer 60, and a first metal layer 62. The first dielectric layer 52 may be formed over the substrate 50. In some embodiments, the first dielectric layer 52 may include silicon oxide ($SiO_2$), silicon nitride (SiN), polysilicon (poly-Si), silicon carbonitride (SiCN), silicon oxycarbide (SiOC), silicon oxycarbonitride (SiOCN), combinations or multiple layers thereof, or the like. The first dielectric layer 52 may be formed of an oxide (e.g., silicon oxide or the like), a nitride (e.g., silicon nitride or the like), or the like. The first dielectric layer 52 may be deposited by chemical vapor deposition (CVD), atomic layer deposition (ALD), or the like. The first dielectric layer 52 may have a thickness from about 5 nm to about 500 nm.

The second dielectric layer 54 may be formed over the first dielectric layer 52. In some embodiments, the second dielectric layer 54 may include silicon oxide ($SiO_2$), silicon nitride (SiN), polysilicon (poly-Si), silicon carbonitride (SiCN), silicon oxycarbide (SiOC), silicon oxycarbonitride (SiOCN), combinations or multiple layers thereof, or the like. The second dielectric layer 54 may be deposited by CVD, ALD, or the like. The second dielectric layer 54 may have a thickness from about 5 nm to about 500 nm. In some embodiments, the second dielectric layer 54 may be formed of a material having a high etch selectivity to materials of the first dielectric layer 52, the third dielectric layer 56, the fourth dielectric layer 58, the semiconductor layer 60, and the first metal layer 62, which is a ratio of the etching rate of the second dielectric layer 54 to etching rates of the first dielectric layer 52, the third dielectric layer 56, the fourth dielectric layer 58, the semiconductor layer 60, and the first metal layer 62. As such, portions of the second dielectric layer 54 may be removed, while minimizing etching of the first dielectric layer 52, the third dielectric layer 56, the fourth dielectric layer 58, the semiconductor layer 60, and the first metal layer 62, as will be discussed below with respect to FIGS. 10A through 10D.

The third dielectric layer 56 may be formed over the second dielectric layer 54. In some embodiments, the third dielectric layer 56 may include silicon oxide ($SiO_2$), silicon nitride (SiN), polysilicon (poly-Si), silicon carbonitride (SiCN), silicon oxycarbide (SiOC), silicon oxycarbonitride (SiOCN), combinations or multiple layers thereof, or the like. The third dielectric layer 56 may be deposited by CVD, ALD, or the like. The third dielectric layer 56 may have a thickness from about 5 nm to about 500 nm. In some embodiments, the thickness of the third dielectric layer 56 may be the same as the thickness of the first dielectric layer 52. In some embodiments, the second dielectric layer 54 may have a thickness greater than thicknesses of the first dielectric layer 52 and the third dielectric layer 56. For example, a ratio of the thickness of the second dielectric layer 54 to the thickness of the first dielectric layer 52 or the thickness of the third dielectric layer 56 may be from about 1 to about 100.

The fourth dielectric layer 58 may be formed over the third dielectric layer 56. In some embodiments, the fourth dielectric layer 58 may include silicon oxide ($SiO_2$), silicon nitride (SiN), polysilicon (poly-Si), silicon carbonitride (SiCN), silicon oxycarbide (SiOC), silicon oxycarbonitride (SiOCN), combinations or multiple layers thereof, or the like. The fourth dielectric layer 58 may be deposited by CVD, ALD, or the like. The fourth dielectric layer 58 may have a thickness from about 5 nm to about 500 nm.

The semiconductor layer 60 may be formed over the fourth dielectric layer 58. In some embodiments, the semiconductor layer 60 may include a semiconductor material (e.g., silicon, polysilicon (poly-Si), silicon germanium (SiGe), silicon carbide (SiC), or the like), an oxide semiconductor material (e.g., indium gallium zinc oxide (IGZO), zinc oxide (ZnO), indium zinc oxide (IZO), indium tungsten oxide (IWO), indium tin oxide (ITO), or the like), combinations or multiple layers thereof, or the like. The semiconductor layer 60 may be deposited by CVD, ALD, vapor phase epitaxy (VPE), molecular beam epitaxy (MBE), or the like. The semiconductor layer 60 may have a thickness from about 5 nm to about 500 nm.

The first metal layer 62 may be formed over the semiconductor layer 60. In some embodiments, the first metal layer 62 may include a metal material such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), combinations or multiple layers thereof, or the like. The first metal layer 62 may be deposited by CVD, ALD, or the like. The first metal layer 62 may have a thickness from about 5 nm to about 500 nm.

A thermal anneal process, such as a rapid thermal anneal (RTA) may be performed to form a low-resistance contact (e.g. an Ohmic contact) between the first metal layer 62 and the semiconductor layer 60. The thermal anneal process may be performed at a temperature from about 200° C. to about 350° C. or less than about 400° C. The thermal anneal process may be performed for between about 0.1 seconds and about 60 minutes.

In FIGS. 3A through 3D, a patterned hard mask layer 64 is formed over the first metal layer 62. In some embodiments, forming the patterned hard mask layer 64 may include depositing a hard mask layer over the first metal layer 62 and patterning the hard mask layer using a lithography process to form the patterned hard mask layer 64. The hard mask layer may be deposited by CVD, ALD, or the like. The hard mask layer may be formed of silicon oxide, silicon nitride, silicon carbide, amorphous silicon, titanium nitride, silicon oxynitride, silicon carbonitride, combinations or multiple layers thereof, or the like. The hard mask layer may be deposited to a thickness from about 5 nm to about 500 nm.

A patterned mask (not separately illustrated), such as a patterned photoresist, may be formed over the hard mask layer. The patterned mask may be formed by depositing a photosensitive layer over the hard mask layer using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned mask. The hard mask layer may be etched by a suitable etching process, such as an anisotropic etching process, to transfer the pattern of the patterned mask to the hard mask layer, forming the patterned hard mask layer 64. In some embodiments, the etching process may include reactive ion etching (RIE), neutral beam etching (NBE), the like, or a combination thereof. The patterned mask may then be removed by any acceptable process, such as an ashing process, a stripping process, the like, or a combination thereof.

Further in FIGS. 3A through 3D, the first metal layer 62, the semiconductor layer 60, and the fourth dielectric layer 58 are etched to expose the third dielectric layer 56 using the patterned hard mask layer 64 as a mask. The first metal layer 62, the semiconductor layer 60, and the fourth dielectric layer 58 may be etched by a suitable etching process, such as an anisotropic etching process, to transfer the pattern of the patterned hard mask layer 64 to the first metal layer 62, the semiconductor layer 60, and the fourth dielectric layer 58. In some embodiments, the etching process may include RIE, NBE, the like, or a combination thereof. In some embodiments, the etching process may include etchants such as carbon tetrafluoride ($CF_4$), octafluorocyclobutane ($C_4F_8$), boron trichloride ($BCl_3$), chlorine ($Cl_2$), carbon tetrachloride ($CCl_4$), silicon tetrachloride ($SiCl_4$), difluoromethane ($CH_2F_2$), combinations thereof, or the like. The first metal layer 62, the semiconductor layer 60, and the fourth dielectric layer 58 may be patterned such that the semiconductor layer 60 has a width $W_1$ from about 1 nm to about 100 nm. The central portion of the semiconductor layer 60 may be a nanostructure 61.

Figure 3B:
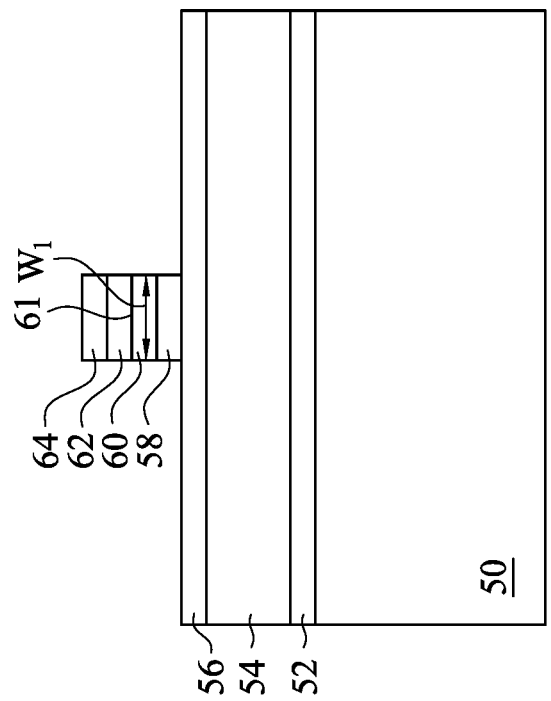
Figure 3A:
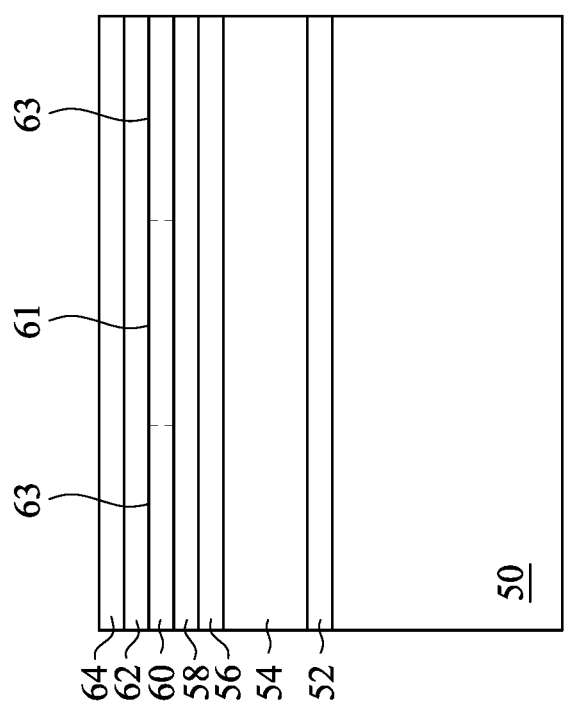
Figure 3D:
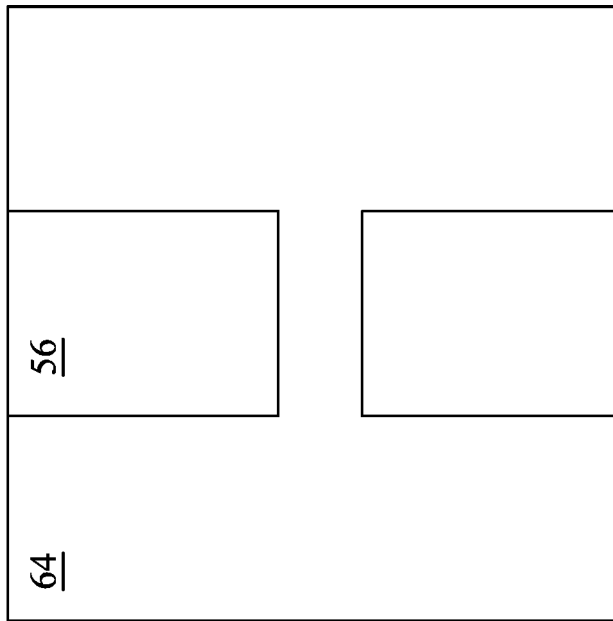
Figure 3C:
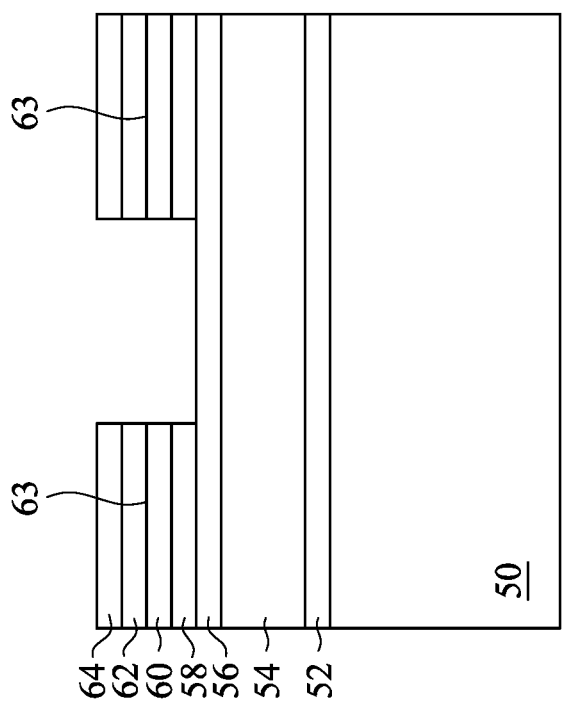

Various portions of the semiconductor layer 60 may serve as channel regions and source/drain regions in the nano-FET. For example, the nanostructure 61 formed in the central portion of the semiconductor layer 60 may serve as a channel region. As illustrated in FIGS. 3A and 3C, end portions of the semiconductor layer 60 may serve as source/drain regions 63. In some embodiments, various implant steps may be performed on the nanostructure 61 and the source/drain regions 63 to alter the conductivity of the nanostructure 61 and the source/drain regions 63. The implant steps may include forming a photoresist over the structures to be implanted. The photoresist may be formed by using a spin-on technique and may be patterned using acceptable photolithography techniques. N-type impurities, such as phosphorous, arsenic, antimony, or the like, and p-type impurities, such as boron, boron fluoride, indium, or the like may be implanted into the nanostructure 61 and/or the source/drain regions 63. The implantations may be performed before the first metal layer 62 is formed, after the first metal layer 62, the semiconductor layer 60, and the fourth dielectric layer 58 are patterned, after a gate stack (such as a gate stack including gate dielectric layers 70 and the gate electrode 74, discussed below with respect to FIGS. 6A-7D) is formed around the nanostructure 61, or the like.

In some embodiments, lithography processes such as double-patterning, multi-patterning, or the like may be used to pattern the first metal layer 62, the semiconductor layer 60, and the fourth dielectric layer 58. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the first metal layer 62, the semiconductor layer 60, and the fourth dielectric layer 58. In some embodiments, a mask (or other layer) may remain on the fourth dielectric layer 58 after patterning the first metal layer 62, the semiconductor layer 60, and the fourth dielectric layer 58.

Figure 4A:
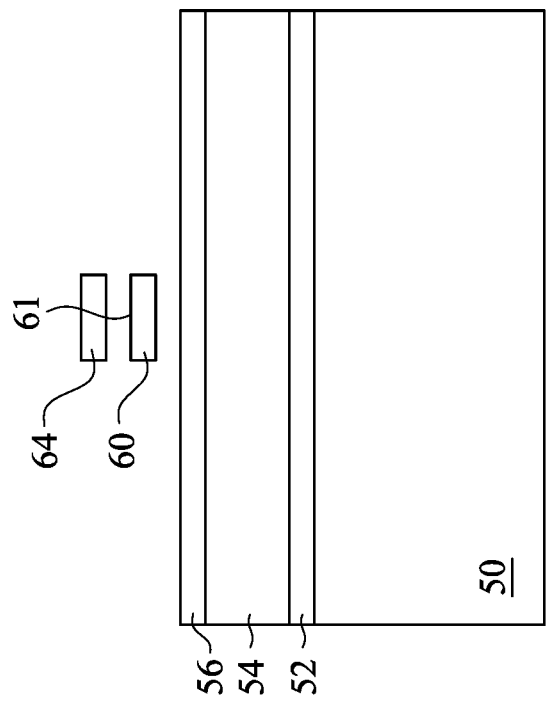
Figure 4B:
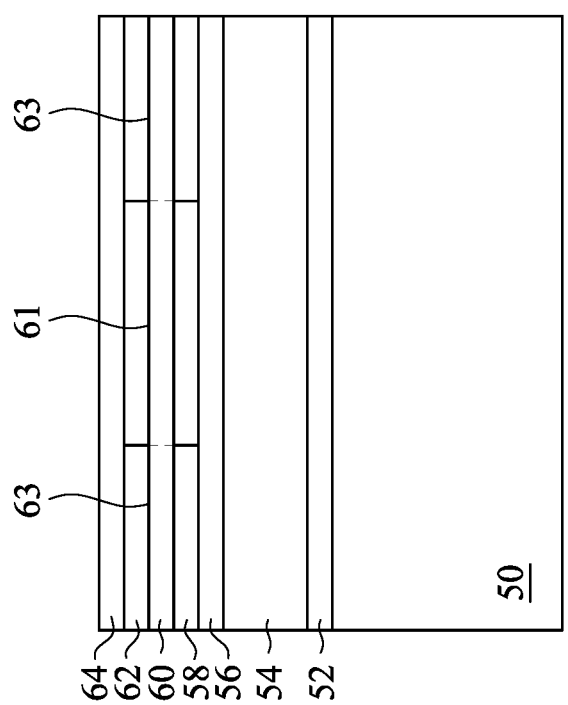
Figure 4D:
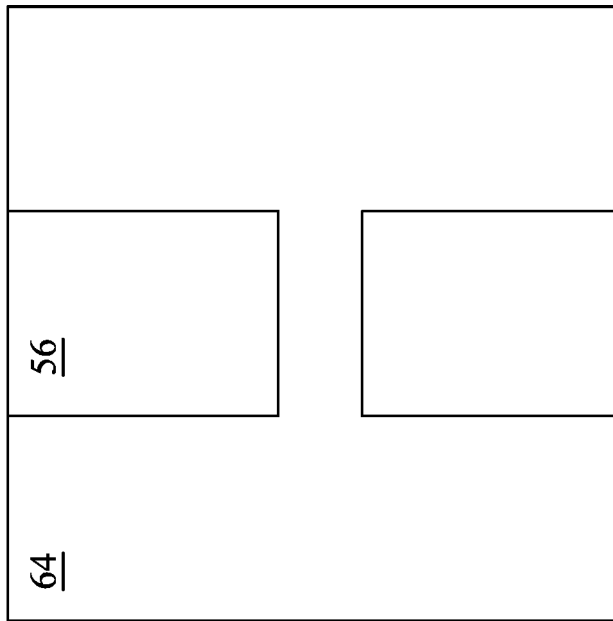
Figure 4C:
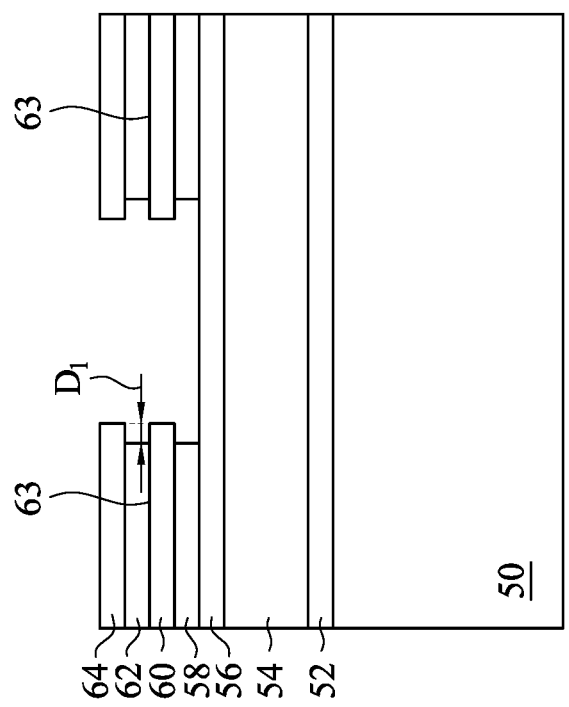
Figure 5A:
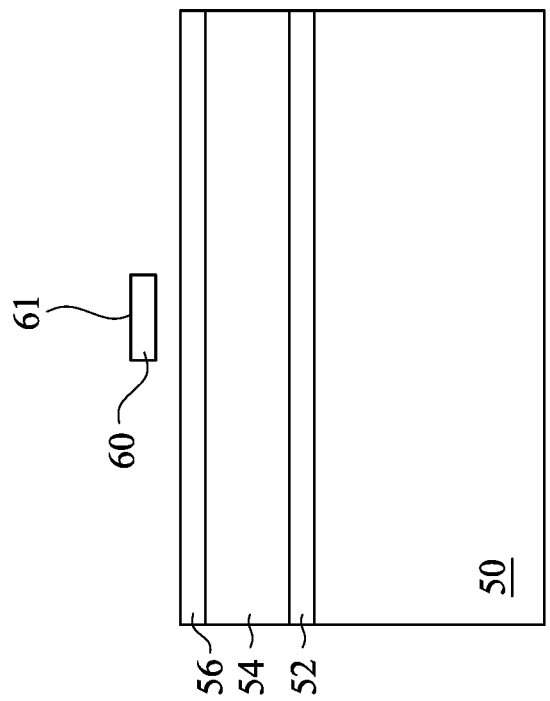
Figure 5B:
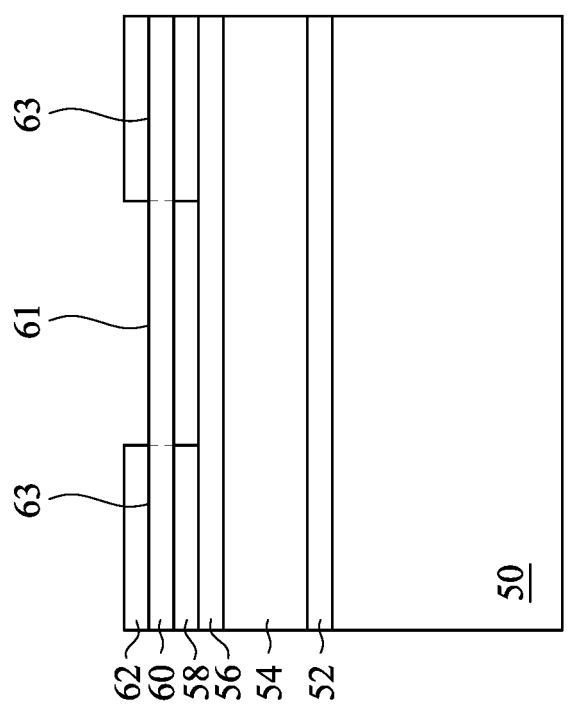
Figure 5D:
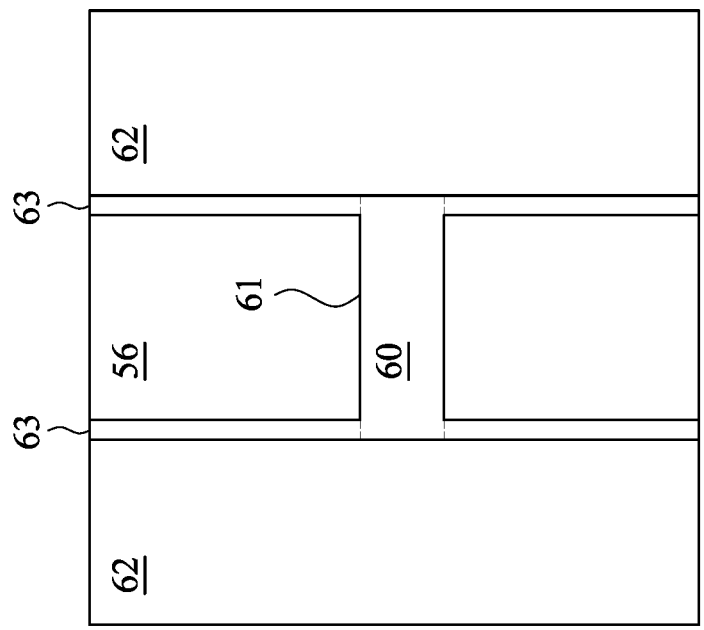
Figure 5C:
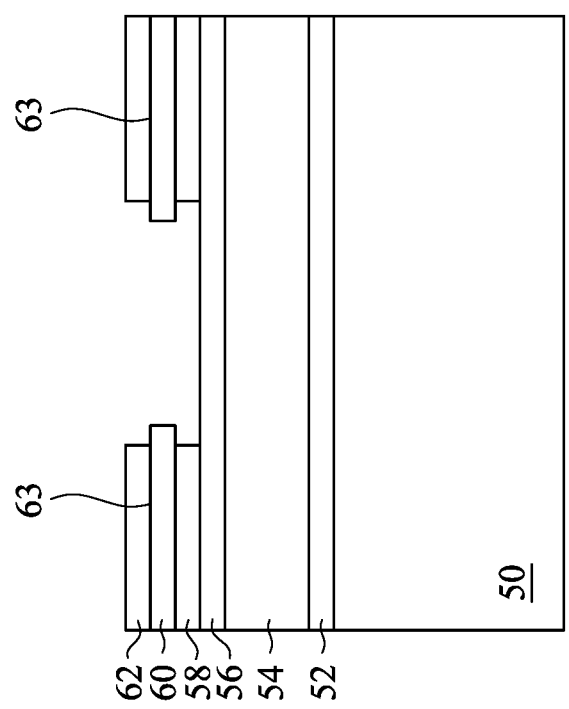

In FIGS. 4A through 4D, the first metal layer 62 and the fourth dielectric layer 58 are etched. As illustrated in FIGS. 4A and 4B, the first metal layer 62 and the fourth dielectric layer 58 may be removed from above and below the semiconductor layer 60, respectively, in a channel region, while the first metal layer 62 and the fourth dielectric layer 58 remain relatively unetched in source/drain regions. As illustrated in FIGS. 4A and 4C, sidewalls of the first metal layer 62 and the fourth dielectric layer 58 may be etched in the source/drain regions. The sidewalls of the first metal layer 62 and the fourth dielectric layer 58 may be etched to a depth $D_1$ from about 1 nm to about 10 nm, or less than about 10 nm. As such, sidewalls of the first metal layer 62 and the fourth dielectric layer 58 may be misaligned with sidewalls of the semiconductor layer 60.

The first metal layer 62 and the fourth dielectric layer 58 may be etched by a suitable etching process, which may be an isotropic etching process, such as a wet etching process. The etching process may have a high etch selectivity to materials of the semiconductor layer 60 and the third dielectric layer 56, which is a ratio of the etching rates of the first metal layer 62 and the fourth dielectric layer 58 to the etching rates of the semiconductor layer 60 and the third dielectric layer 56. As such, the portions of the first metal layer 62 and the fourth dielectric layer 58 may be removed, while minimizing any undesired etching of the semiconductor layer 60 and the third dielectric layer 56.

In FIGS. 5A through 5D, the patterned hard mask layer 64 is removed. The patterned hard mask layer 64 may be removed by a suitable etching process, which may be an isotropic etching process, such as a wet etching process. The etching process may have a high etch selectivity to materials of the patterned hard mask layer 64, which is a ratio of the etching rate of the patterned hard mask layer 64 to the etching rates of the first metal layer 62, the semiconductor layer 60, the fourth dielectric layer 58, and the third dielectric layer 56. As such, the patterned hard mask layer 64 may be removed, while minimizing any undesired etching of the first metal layer 62, the semiconductor layer 60, the fourth dielectric layer 58, and the third dielectric layer 56.

Figure 6A:
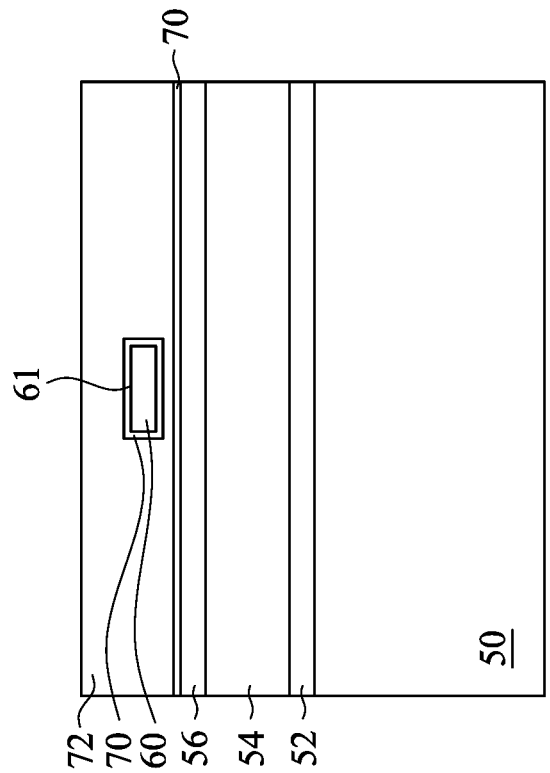
Figure 6B:
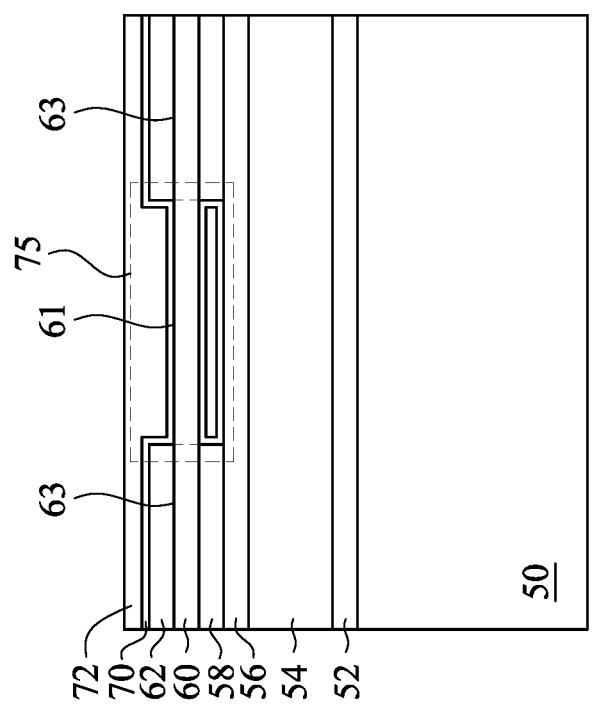
Figure 6D:
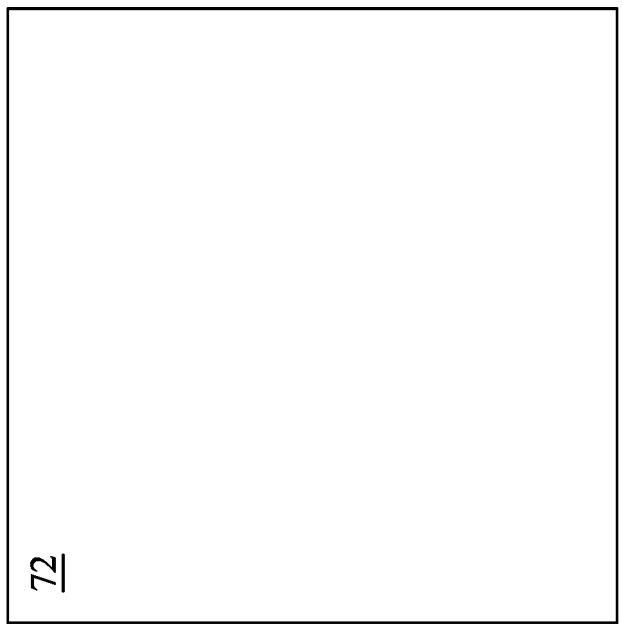
Figure 6C:
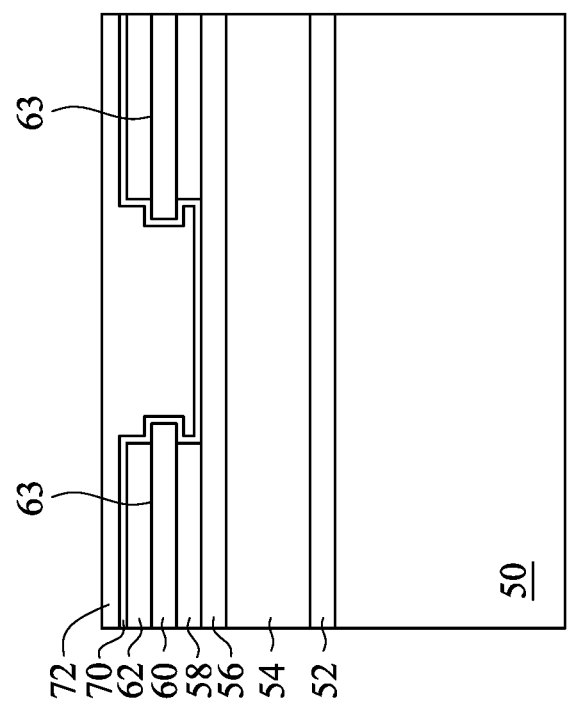
Figure 6E:
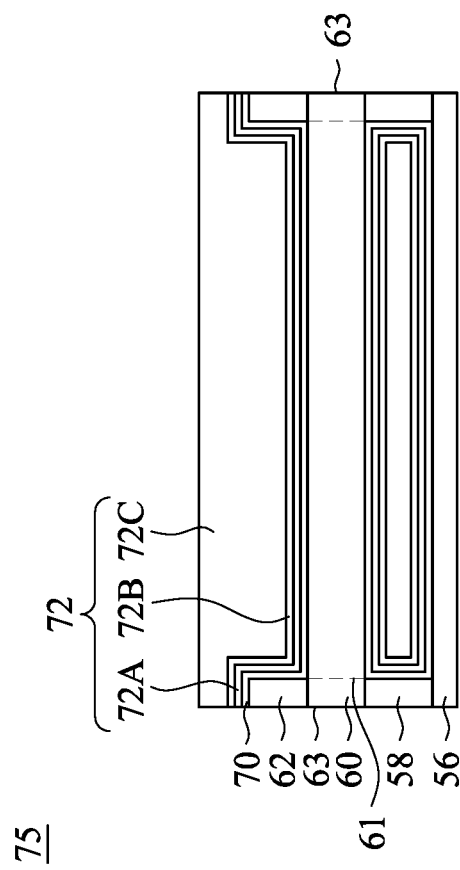

In FIGS. 6A through 6E, gate dielectric layers 70 and a gate electrode material 72 are formed over the structures illustrated in FIGS. 5A through 5D. FIG. 6E illustrates a detailed view of region 75 of FIG. 6A. The gate dielectric layers 70 are formed conformally along top surfaces, sidewalls, and bottom surfaces of the semiconductor layer 60, along top surfaces and sidewalls of the first metal layer 62, along sidewalls of the fourth dielectric layer 58, and along top surfaces of the third dielectric layer 56. The gate dielectric layers 70 may be formed by CVD, ALD, or the like. In some embodiments, the gate dielectric layers 70 may include materials such as silicon oxide, silicon nitride, combinations or multiple layers thereof, or the like. The gate dielectric layers 70 may include a high-k dielectric material having a k-value greater than about 7.0 and may include a metal oxide or a silicate of hafnium, aluminum, zirconium, lanthanum, manganese, barium, titanium, lead, combinations thereof, or the like. The gate dielectric layers 70 may have a thickness from about 0.5 nm to about 10 nm.

Further in FIGS. 6A through 6E, the gate electrode material 72 is formed over the gate dielectric layers 70. The gate electrode material 72 may be formed by CVD, ALD, or the like. In some embodiments, the gate electrode material 72 may include materials such as silicon oxide, silicon nitride, combinations or multiple layers thereof, or the like. The gate electrode material 72 may include metal-containing materials such as titanium nitride (TiN), titanium oxide (TaO$_x$), tantalum nitride (TaN), tantalum carbide (TaO$_x$), cobalt (Co), ruthenium (Ru), aluminum (Al), tungsten (W), silver (Ag), gold (Au), copper (Cu), nickel (Ni), chromium (Cr), hafnium (Hf), platinum (Pt), combinations or multiple layers thereof, or the like. Although a single layer gate electrode material 72 is illustrated in FIGS. 6A through 6C, the gate electrode material 72 may comprise any number of liner layers 72A, any number of work function tuning layers 72B, and a fill material 72C as illustrated by FIG. 6E. As illustrated in FIGS. 6A, 6B, and 6E, the gate electrode material 72 may fill the space between the semiconductor layer 60 and the third dielectric layer 56.

In FIGS. 7A through 7D, the gate electrode material 72 is planarized and patterned to form a gate electrode 74. The gate electrode material 72 may be planarized by a suitable planarization process, such as a chemical mechanical polish (CMP), an etch-back process, a combination thereof, or the like. After the planarization process, top surfaces of the gate electrode material 72 may be level with top surfaces of the gate dielectric layers 70 and top surfaces of the first metal layer 62.

Further in FIGS. 7A through 7D, the gate electrode material 72 is patterned to form the gate electrode 74. A patterned mask, such as a patterned photoresist, may be formed over the gate electrode material 72. The patterned photoresist may be formed by depositing a photoresist layer over the gate electrode material 72 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist. The gate electrode material 72 may then be patterned by a suitable etching process, such as an anisotropic etching process, to transfer the pattern of the patterned photoresist to the gate electrode material 72. In some embodiments, the etching process may include RIE, NBE, the like, or a combination thereof. The patterned photoresist may then be removed. In some embodiments, the pattern of the gate electrode 74 may also be transferred to the gate dielectric layers 70. The pattern of the gate electrode 74 may be used to physically separate each gate electrode 74 from adjacent gate electrodes 74. The gate electrode 74 may have a lengthwise direction substantially perpendicular to a lengthwise direction of the nanostructure 61 of the semiconductor layer 60. The gate dielectric layers 70 and the gate electrode 74 may be collectively referred to as a "gate stack." The gate electrode 74 may have a gate length from about 5 nm to about 500 nm.

In FIGS. 8A through 8D, a first interlayer dielectric (ILD) 80 is deposited over the structures illustrated in FIGS. 7A through 7D and the first ILD 80 is planarized. The first ILD 80 may be formed of a dielectric material, and may be deposited by any suitable method, such as CVD, plasma-enhanced CVD (PECVD), flowable CVD (FCVD) (e.g., a CVD-based material deposition in a remote plasma system with post curing to convert the deposited material to another material, such as an oxide), a combination thereof, or the like. In some embodiments, the first ILD 80 may be formed from dielectric materials including phospho-silicate glass (PSG), boro-silicate glass (BSG), boron-doped phospho-silicate glass (BPSG), undoped silicate glass (USG), combinations or multiple layers thereof, or the like. Other insulation materials formed by any acceptable process may be used.

In some embodiments, a liner layer (not separately illustrated) may be deposited before depositing the first ILD 80. For example, the liner layer may be deposited between the first ILD 80 and the gate dielectric layers 70, the gate electrode 74, the third dielectric layer 56, the fourth dielectric layer 58, the semiconductor layer 60, and the first metal layer 62. The liner layer may comprise a dielectric material, such as, silicon nitride, silicon oxide, silicon oxynitride, or the like, having a different etch rate than the material of the overlying first ILD 80.

Figure 7A:
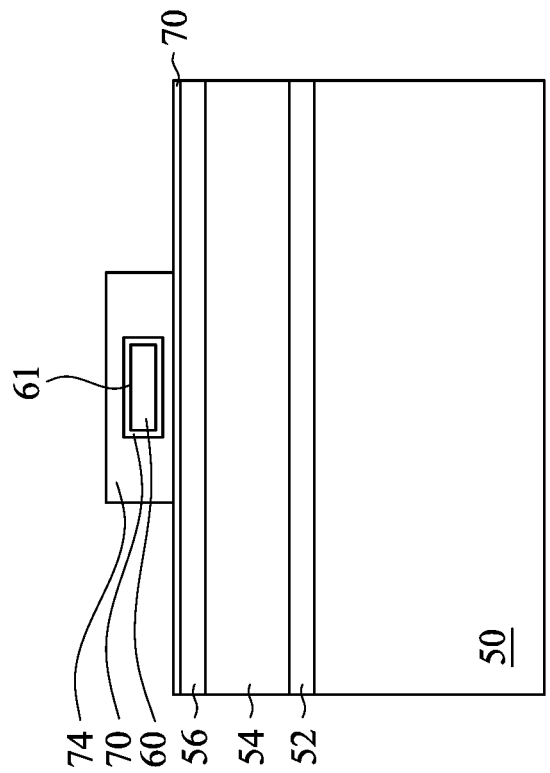
Figure 7B:
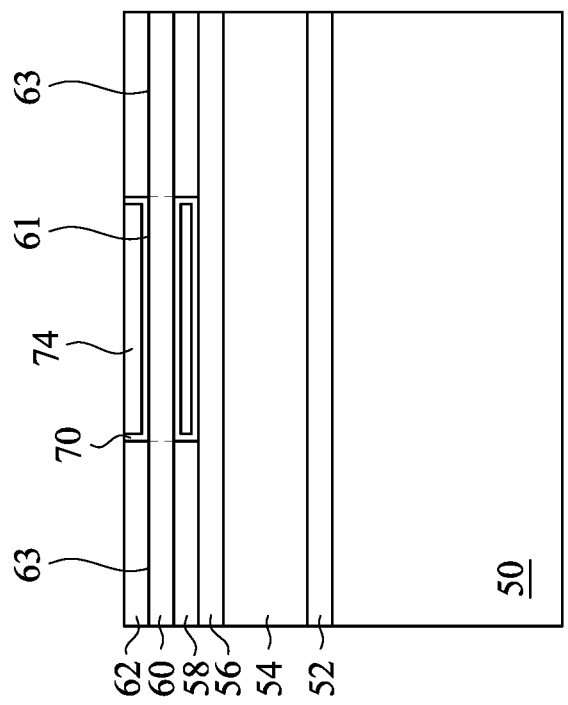
Figure 7D:
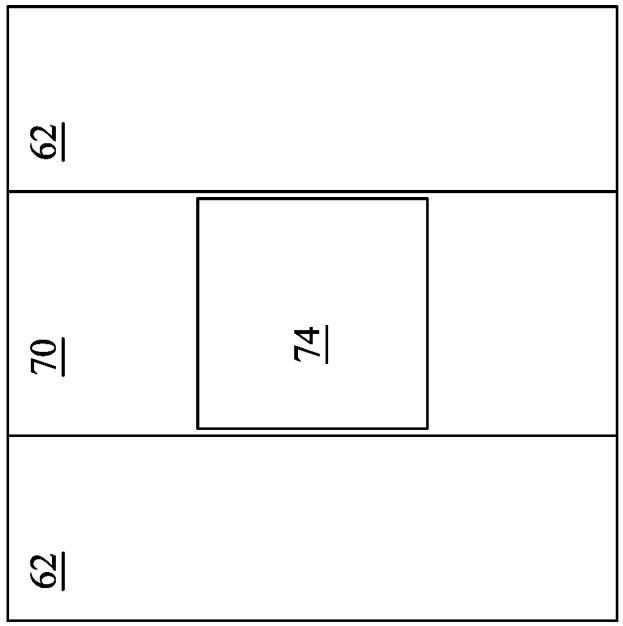
Figure 7C:
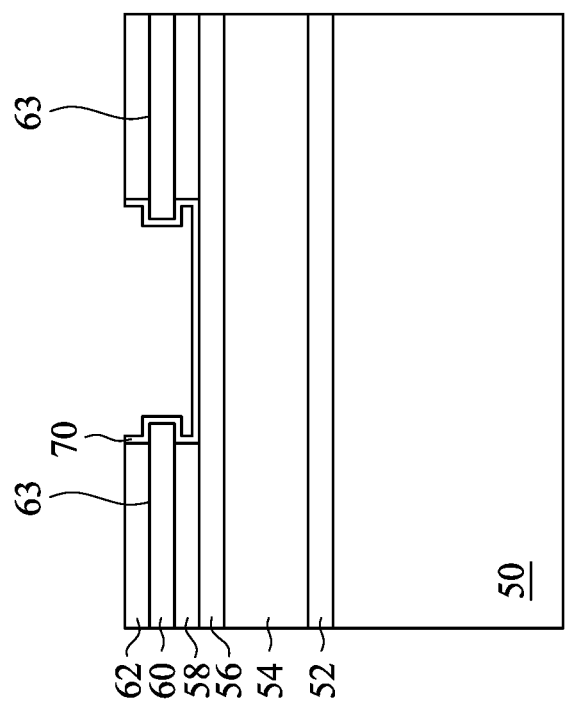
Figure 8A:
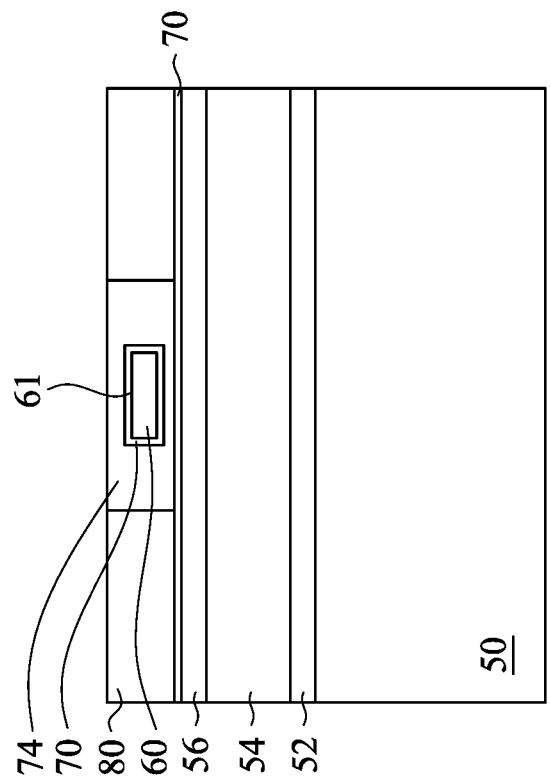
Figure 8B:
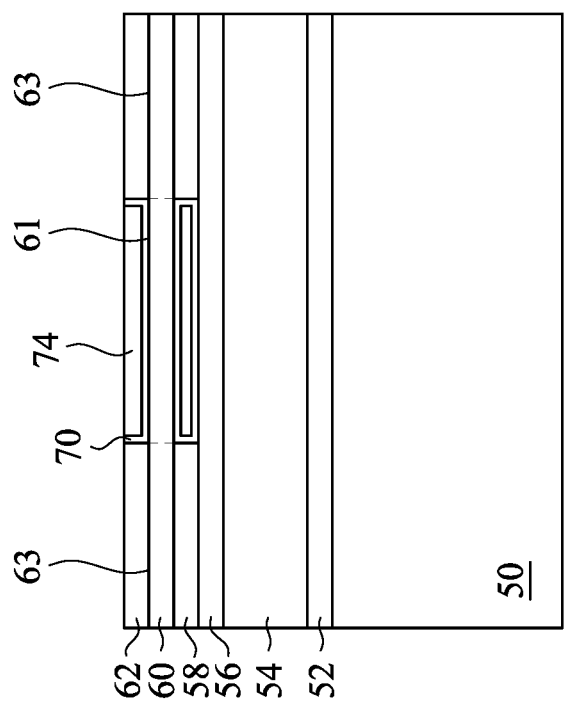
Figure 8D:
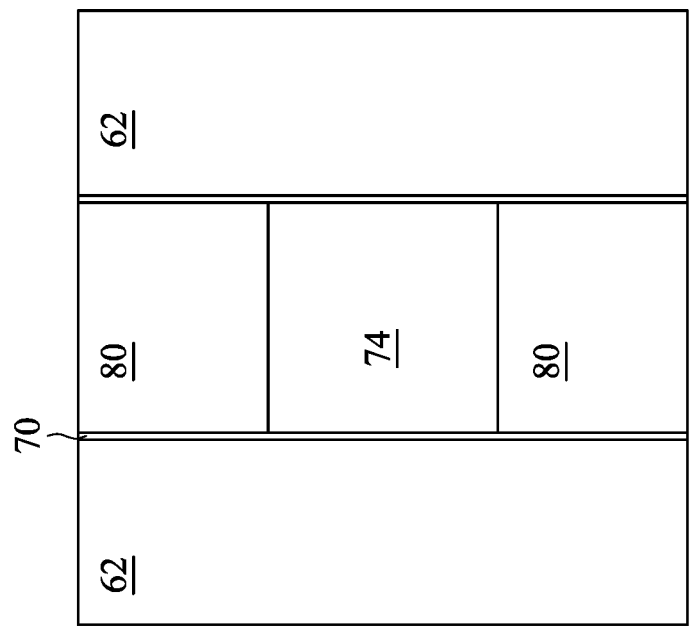
Figure 8C:
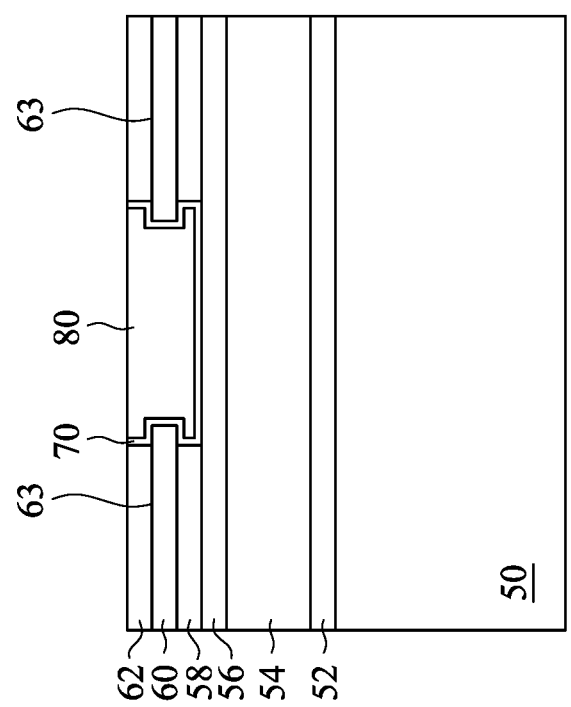
Figure 9D:
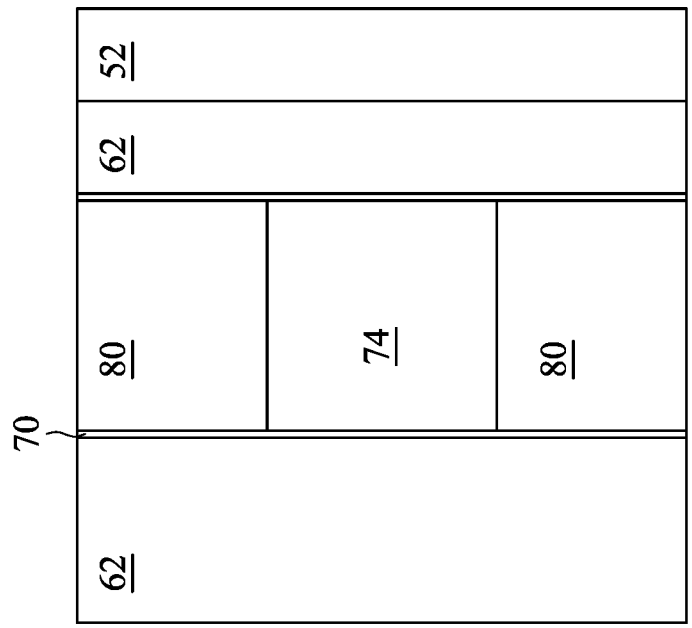
Figure 9C:
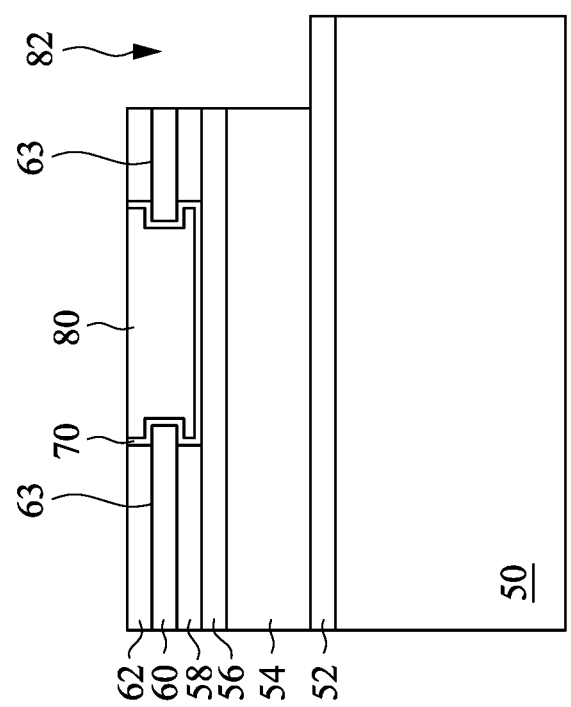

The first ILD 80 may then be planarized by a suitable planarization process, such as a CMP, an etch-back process, a combination thereof, or the like. As illustrated in FIGS. 7A and 7B, following the planarization process, top surfaces of the first ILD 80 may be level with top surfaces of the first metal layer 62, the gate dielectric layers 70, and the gate electrode 74. In embodiments including the liner layer, top surfaces of the liner layer may also be level with top surfaces of the first ILD 80, the first metal layer 62, the gate dielectric layers 70, and the gate electrode 74.

In FIGS. 9A through 9D, the first metal layer 62, the semiconductor layer 60, the fourth dielectric layer 58, the third dielectric layer 56, and the second dielectric layer 54 are etched to form a first opening 82 exposing the first dielectric layer 52. A patterned mask, such as a patterned photoresist, may be formed over the first metal layer 62. The patterned photoresist may be formed by depositing a photoresist layer over the first metal layer 62 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist.

The first metal layer 62, the semiconductor layer 60, the fourth dielectric layer 58, the third dielectric layer 56, and the second dielectric layer 54 may then be patterned by a suitable etching process, such as an anisotropic etching process, to transfer the pattern of the patterned photoresist to the first metal layer 62, the semiconductor layer 60, the fourth dielectric layer 58, the third dielectric layer 56, and the second dielectric layer 54. In some embodiments, the etching process may include RIE, NBE, the like, or a combination thereof. The etching process may be stopped when the first dielectric layer 52 is exposed. The patterned photoresist may then be removed. In some embodiments, the etch process may be stopped when the second dielectric layer 54 is exposed such that only the first metal layer 62, the semiconductor layer 60, the fourth dielectric layer 58, and the third dielectric layer 56 are etched by the etching process.

In FIGS. 10A through 10D, the second dielectric layer 54 is etched through the first opening 82 to extend the first opening 82 under the third dielectric layer 56. The second dielectric layer 54 may be etched by a suitable etching process, such as an isotropic etching process. In some embodiments, the etching process may be a wet etching process. As discussed previously, the second dielectric layer 54 may be formed of a material having a high etch selectivity to materials of the first dielectric layer 52, the third dielectric layer 56, the fourth dielectric layer 58, the semiconductor layer 60, and the first metal layer 62 such that any etching of the first dielectric layer 52, the third dielectric layer 56, the fourth dielectric layer 58, the semiconductor layer 60, and the first metal layer 62 during the etching of the second dielectric layer 54 is minimized. The second dielectric layer 54 may also be formed of materials having high etch selectivity to materials of the gate dielectric layers 70 and the gate electrode 74 to minimize etching the gate dielectric layers 70 and the gate electrode 74 during the etching of the second dielectric layer 54.

In some embodiments, the first dielectric layer 52 and the third dielectric layer 56 may be formed of an oxide, such as silicon oxide, and the second dielectric layer 54 may be formed of silicon nitride, polysilicon, or the like. In embodiments in which the first dielectric layer 52 and the third dielectric layer 56 include silicon oxide and the second dielectric layer 54 includes silicon nitride, phosphoric acid ($H_3PO_4$) may be used to etch the second dielectric layer 54. In embodiments in which the first dielectric layer 52 and the third dielectric layer 56 include silicon oxide and the second dielectric layer 54 includes polysilicon, a mixture of nitric acid ($HNO_3$) and hydrofluoric acid (HF) may be used to etch the second dielectric layer 54.

Figure 10B:
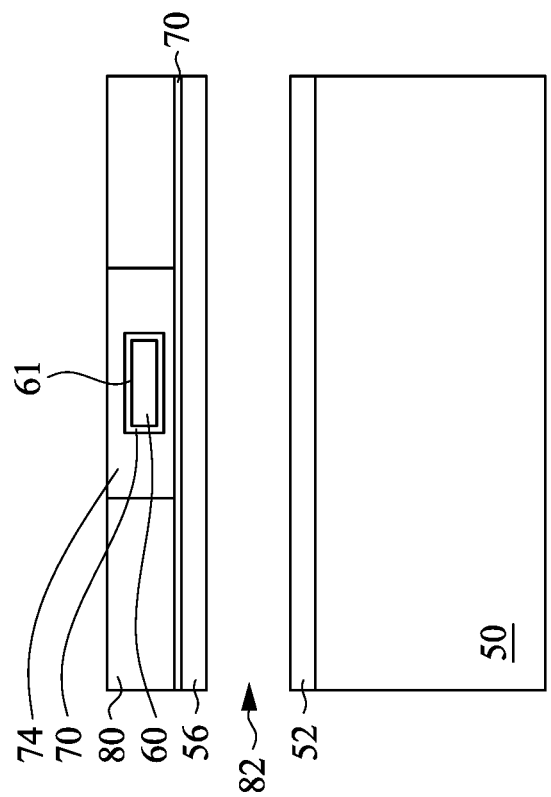
Figure 10A:
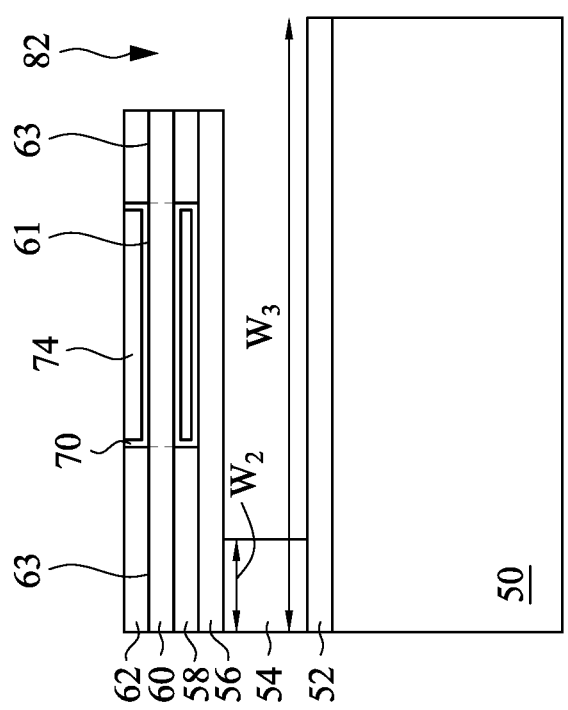
Figure 10D:
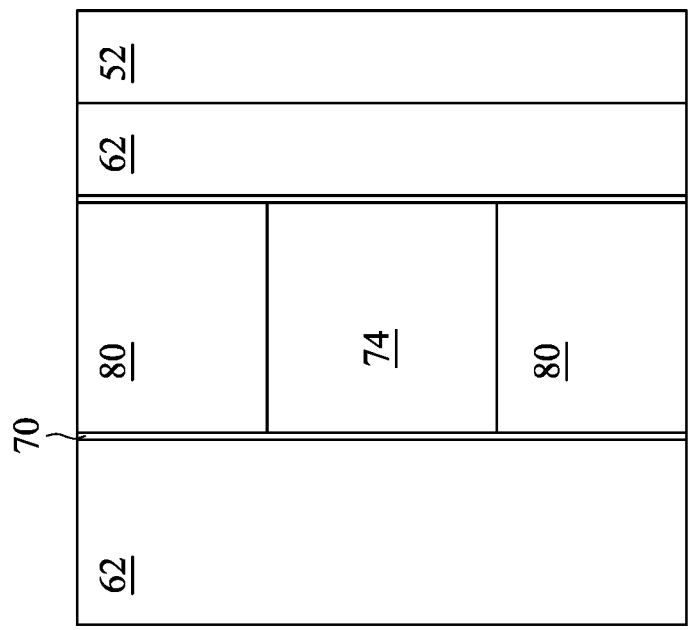
Figure 10C:
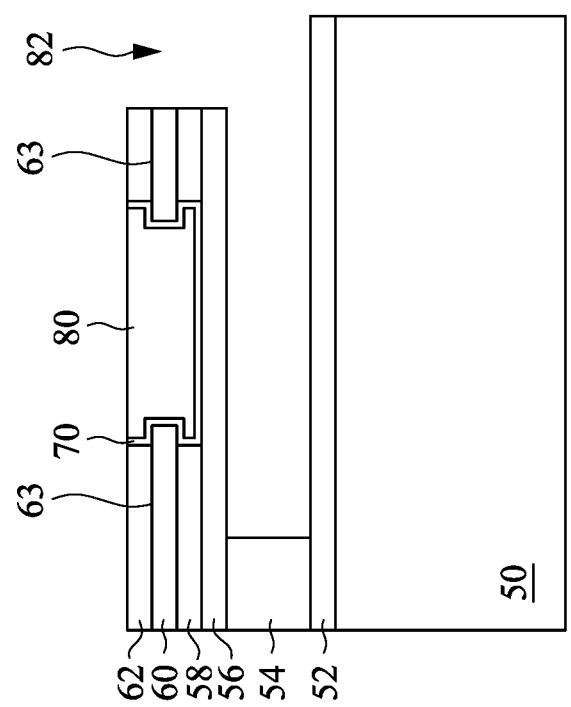
Figure 11B:
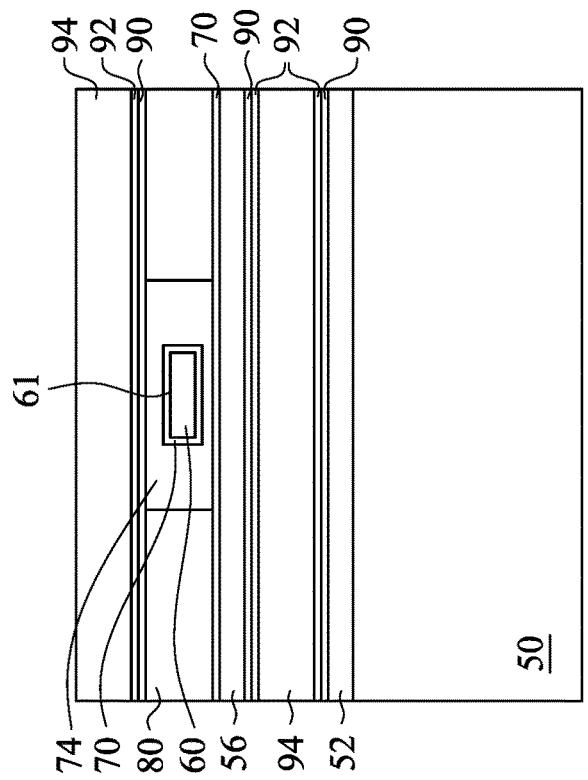
Figure 11A:
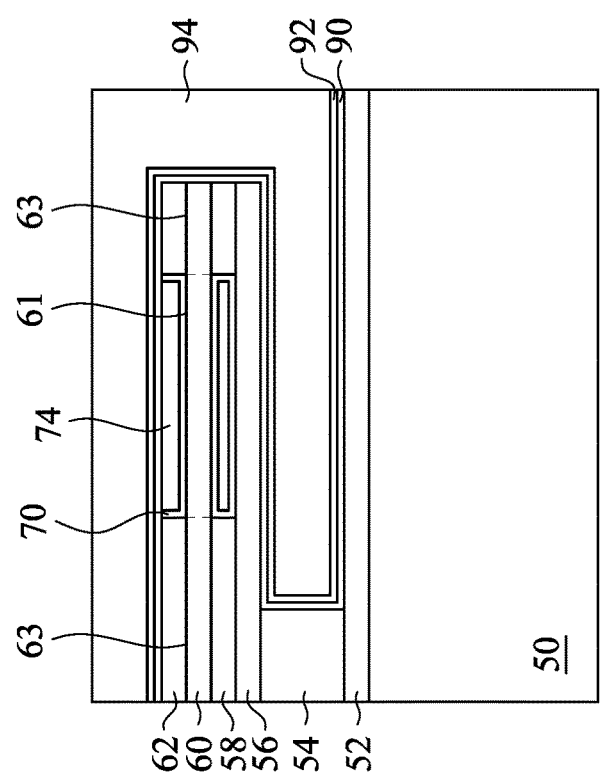
Figure 11D:
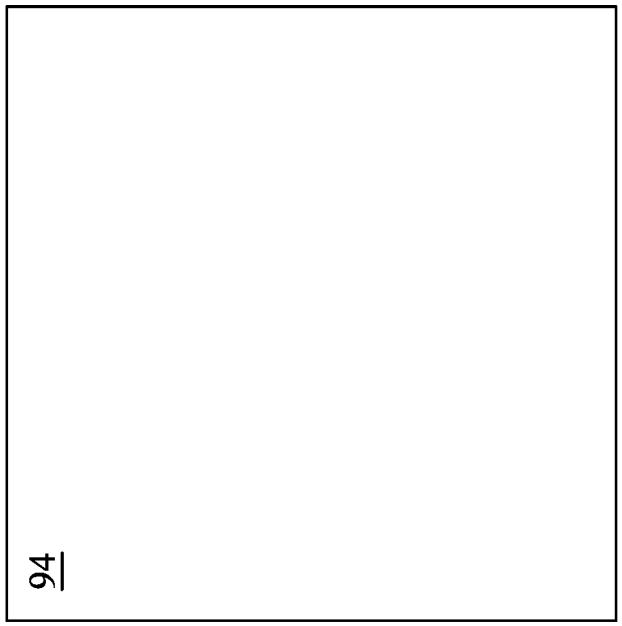
Figure 11C:
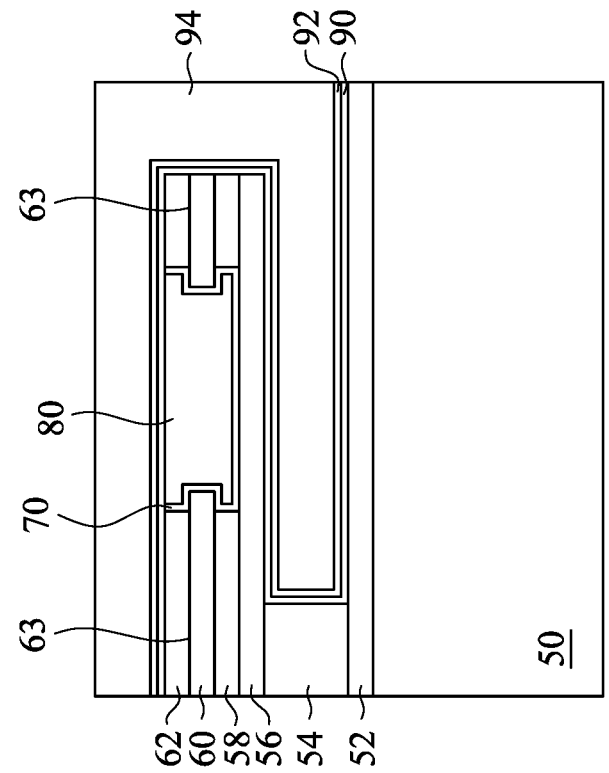
Figure 12B:
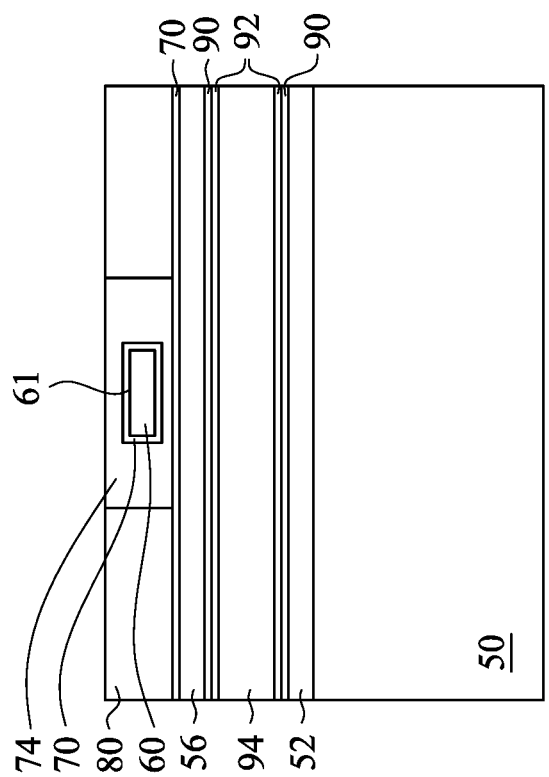
Figure 12A:
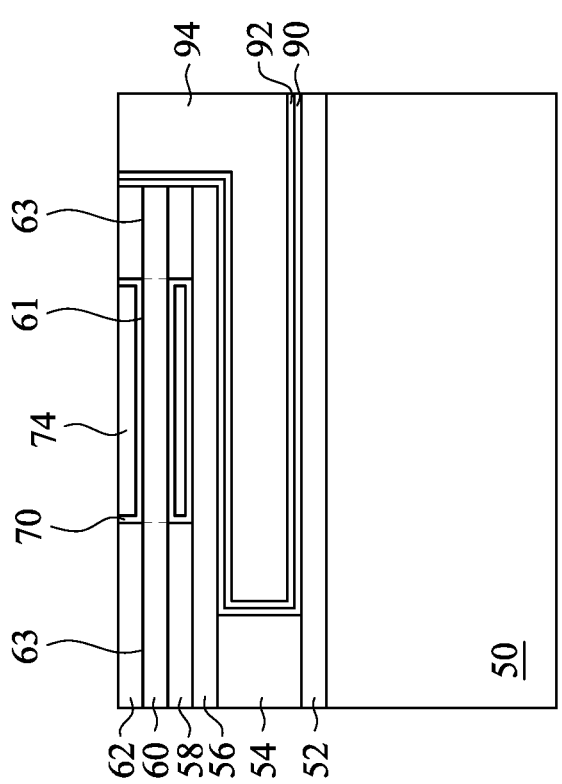
Figure 12D:
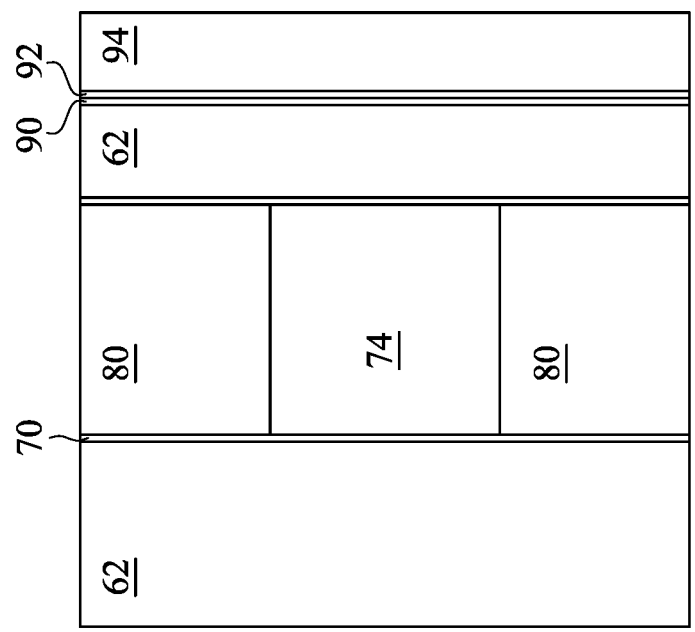
Figure 12C:
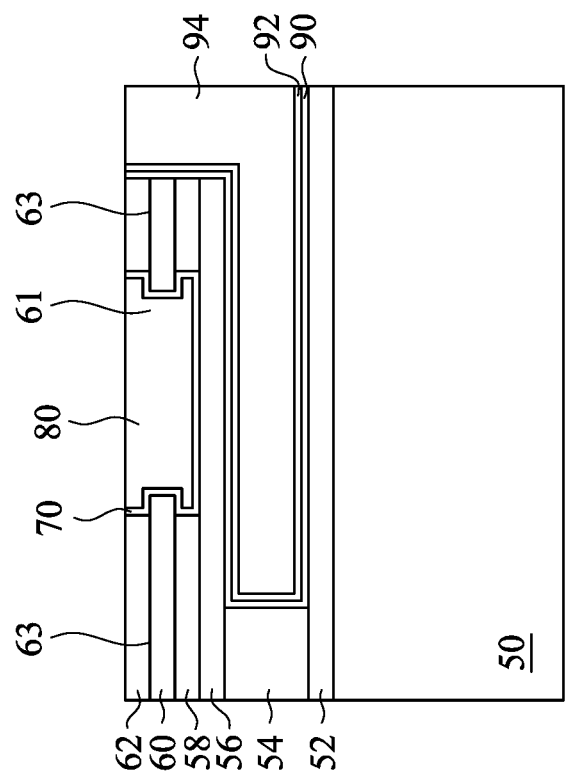
Figure 13B:
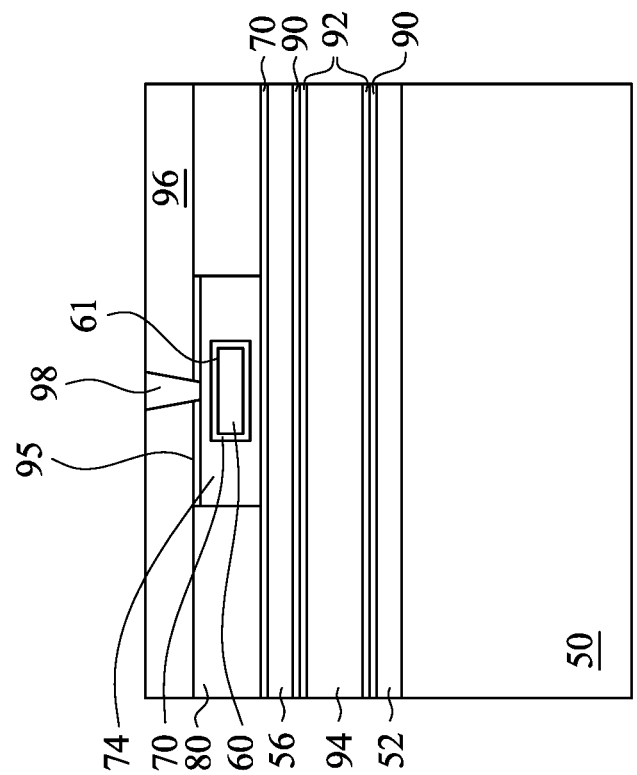
Figure 13A:
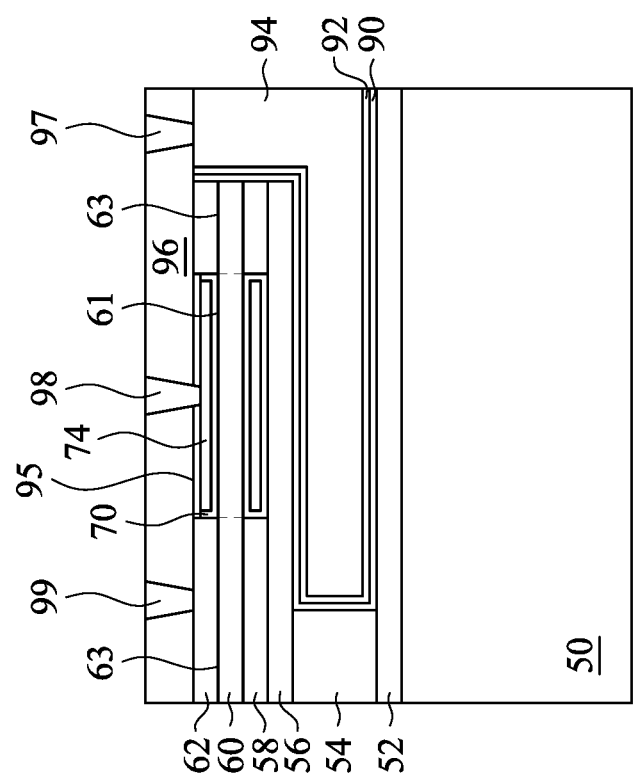
Figure 13D:
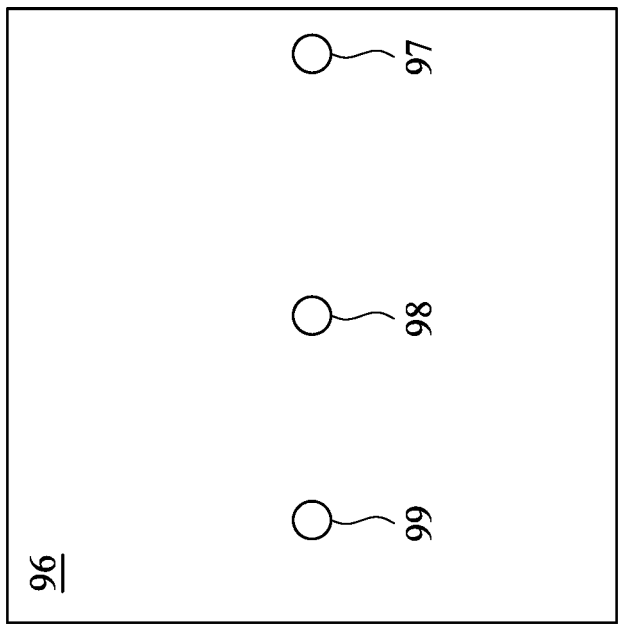
Figure 13C:
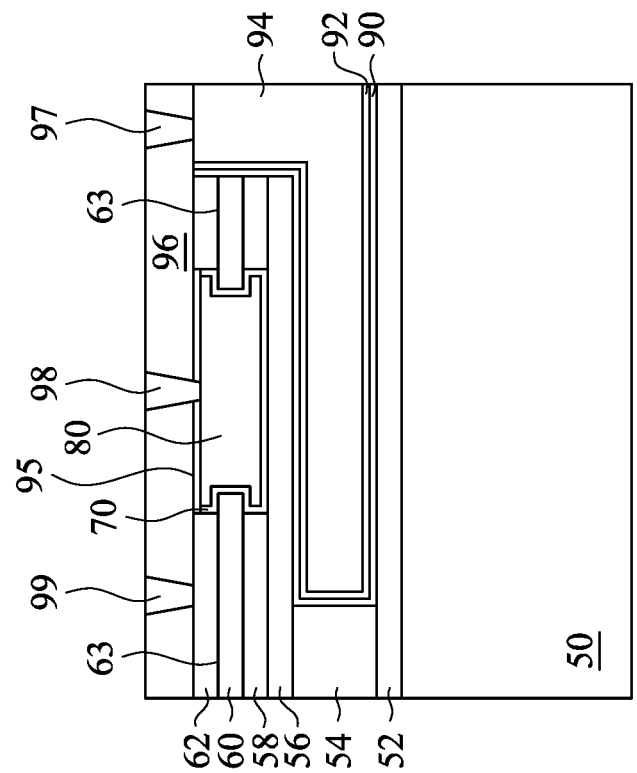

As illustrated in FIGS. 10A and 10C, a portion of the second dielectric layer 54 may remain after etching the second dielectric layer 54. In the embodiment illustrated in FIGS. 10A and 10C, the second dielectric layer 54 may be etched such that the first opening 82 extends under the gate dielectric layers 70 and the gate electrode 74 and under the fourth dielectric layer 58, the semiconductor layer 60, and the first metal layer 62 on opposite sides of the gate stack. In some embodiments, the second dielectric layer 54 may be etched such that the first opening 82 extends under the fourth dielectric layer 58, the semiconductor layer 60, and the first metal layer 62 on one side of the gate stack and under the gate dielectric layers 70 and the gate electrode 74, without extending under the fourth dielectric layer 58, the semiconductor layer 60, and the first metal layer 62 on the opposite side of the gate stack. In some embodiments, the second dielectric layer 54 may be etched such that the first opening 82 extends under the fourth dielectric layer 58, the semiconductor layer 60, and the first metal layer 62 on one side of the gate stack and does not extend under the gate dielectric layers 70 and the gate electrode 74.

The second dielectric layer 54 may be etched using a timed etching process to control the amount of the second dielectric layer 54 that is removed. Removing a greater portion of the second dielectric layer 54 results in a larger first opening 82 in which a capacitor (such as the capacitor including the second metal layer 90, the fifth dielectric layer 92, and the third metal layer 94, discussed below with respect to FIGS. 12A through 12D) may be formed, which increases capacitance of the capacitor. However, etching an excessive amount of the second dielectric layer 54 may cause the device to collapse. As such, a ratio of a width $W_2$ of the second dielectric layer 54 after the etching process to a width $W_3$ of the second dielectric layer 54 prior to the etching process may be greater than about 0.10, greater than about 0.30, or between about 0.30 and about 0.50. The width $W_2$ may be from about 5 nm to about 50 nm, and the width $W_3$ may be from about 5 nm to about 500 nm.

In FIGS. 11A through 11D, a second metal layer 90, a fifth dielectric layer 92, and a third metal layer 94 are formed filling the first opening 82. The second metal layer 90 may be conformally deposited over a top surface of the first dielectric layer 52, a sidewall of the second dielectric layer 54, a bottom surface and sidewall of the third dielectric layer 56, a sidewall of the fourth dielectric layer 58, a sidewall of the semiconductor layer 60, a sidewall and top surfaces of the first metal layer 62, and top surfaces of the gate dielectric layers 70 and the gate electrode 74. In some embodiments, the second metal layer 90 may include a metal material such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), combinations or multiple layers thereof, or the like. The second metal layer 90 may be deposited by physical vapor deposition (PVD), CVD, ALD, or the like. The second metal layer 90 may have a thickness from about 1 nm to about 100 nm.

The fifth dielectric layer 92 may be conformally deposited over the second metal layer 90. In some embodiments, the fifth dielectric layer 92 may include a dielectric material such as hafnium oxide ($HfO_2$), hafnium zirconium oxide ($Hf_{1-x}Zr_xO_2$), zirconium oxide ($ZrO_2$), titanium oxide ($TiO_2$), nickel oxide (NiO), tantalum oxide ($TaO_x$), copper oxide ($Cu_2O$), niobium oxide ($Nb_2O_5$), aluminum oxide ($Al_2O_3$), multiple layers or combinations thereof, or the like. The fifth dielectric layer 92 may be deposited by PVD, CVD, ALD, or the like. The fifth dielectric layer 92 may have a thickness from about 0.5 nm to about 50 nm.

The third metal layer 94 may be conformally deposited over the fifth dielectric layer 92 and may fill the remainder of the first opening 82. In some embodiments, the third metal layer 94 may include a metal material such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), combinations or multiple layers thereof, or the like. The third metal layer 94 may be deposited by PVD, CVD, ALD, or the like. The third metal layer 94 may have a thickness from about 1 nm to about 100 nm.

In FIGS. 12A through 12D, the third metal layer 94, the fifth dielectric layer 92, and the second metal layer 90 are planarized. The third metal layer 94, the fifth dielectric layer 92, and the second metal layer 90 may be planarized by a suitable planarization process, such as a CMP, an etch-back process, a combination thereof, or the like. After the planarization process, top surfaces of the third metal layer 94, the fifth dielectric layer 92, the second metal layer 90, the first metal layer 62, the gate dielectric layers 70, and the gate electrode 74 may be level with one another.

The third metal layer 94, the fifth dielectric layer 92, and the second metal layer 90 may be collectively referred to as a "horizontal capacitor" and may function as a capacitor in a memory cell. Forming the memory cell with a horizontal capacitor which extends under a gate stack allows for the volume of the horizontal capacitor to be increased without increasing the area of the memory cell. This improves read reliability and increases device performance, without increasing memory cell area or decreasing device density. Moreover, the above-described methods for forming horizontal capacitors and nano-FETs may be implemented in existing process flows for forming complementary metal oxide semiconductor (CMOS) devices, which reduces costs.

In FIGS. 13A through 13D, a second ILD 96, a bit line 99, a word line 98, and a source line 97 are formed over the structures illustrated in FIGS. 12A through 12D. In some embodiments, the second ILD 96 is formed of a dielectric material such as PSG, BSG, BPSG, USG, or the like, and may be deposited by any suitable method, such as CVD, PECVD, or the like. In some embodiments, before the formation of the second ILD 96, the gate stack (including the gate dielectric layers 70 and the gate electrode 74) is recessed, so that a recess is formed directly over the gate stack and between opposing portions of the first metal layer 62. A gate mask 95 including one or more layers of dielectric material, such as silicon nitride, silicon oxynitride, or the like, is filled in the recess, followed by a planarization process to remove excess portions of the dielectric material extending over the first ILD 80. Subsequently formed gate contacts (such as the word line 98) penetrate through the gate mask 95 to contact the top surface of the recessed gate electrode 74.

Further in FIGS. 13A through 13D, the bit line 99, the word line 98, and the source line 97 are formed through the second ILD 96. Openings for the bit line 99 and the source line 97 are formed through the second ILD 96 and openings for the word line 98 are formed through the second ILD 96 and the gate mask 95. The openings may be formed using acceptable photolithography and etching techniques. One or more liners, such as a diffusion barrier layer, an adhesion layer, combinations or multiple layers thereof, or the like may be formed in the openings and a conductive material may be formed over the liner(s). The liner(s) may include titanium, titanium nitride, tantalum, tantalum nitride, combinations or multiple layers thereof, or the like. The conductive material may be copper (Cu), a copper alloy, silver (Ag), gold (Au), tungsten (W), cobalt (Co), aluminum (Al), nickel (Ni), titanium nitride (TiN), tantalum nitride (TaN), chromium (Cr), hafnium (Hf), ruthenium (Ru), platinum (Pt), combinations or multiple layers thereof, or the like.

A planarization process, such as a CMP, may be performed to remove excess material from a surface of the second ILD 96. The remaining liner(s) and conductive material form the bit line 99, the word line 98, and the source line 97 in the openings. The bit line 99 is physically and electrically coupled to the first metal layer 62, the word line is physically and electrically coupled to the gate electrode 74, and the source line is physically and electrically coupled to the third metal layer 94. The bit line 99, the word line 98, and the source line 97 may be formed in different processes, or may be formed in the same process. Although shown as being formed in the same cross-sections, it should be appreciated that each of the bit line 99, the word line 98, and the source line 97 may be formed in different cross-sections, which may avoid shorting of the contacts.

Embodiments may achieve advantages. For example, forming the horizontal capacitor extending at least partially under the nano-FET may result in the capacitor volume being increased, without increasing memory cell area, which results in improved read reliability and improved device performance. Moreover, the above-described methods may be implemented with existing CMOS process flows, which reduces costs.

Figure 14A:
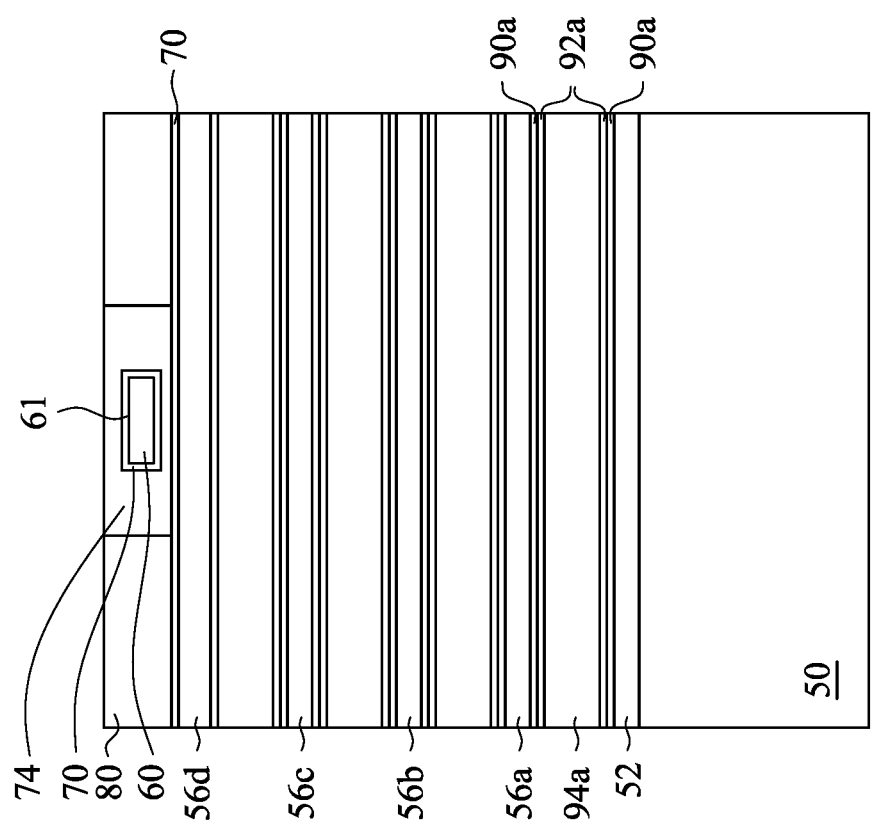
FIGS. 14A, 14B, 15, 16, and 17 are cross-sectional views of semiconductor devices, in accordance with some embodiments.

FIGS. 14A through 17 are cross-sectional views of intermediate stages in the manufacturing of memory cells, in accordance with further embodiments. FIG. 14A illustrates reference cross-section A-A' illustrated in FIG. 1. FIGS. 14B, 15, 16, and 17 illustrate reference cross-section B-B' illustrated in FIG. 1.

Figure 14B:
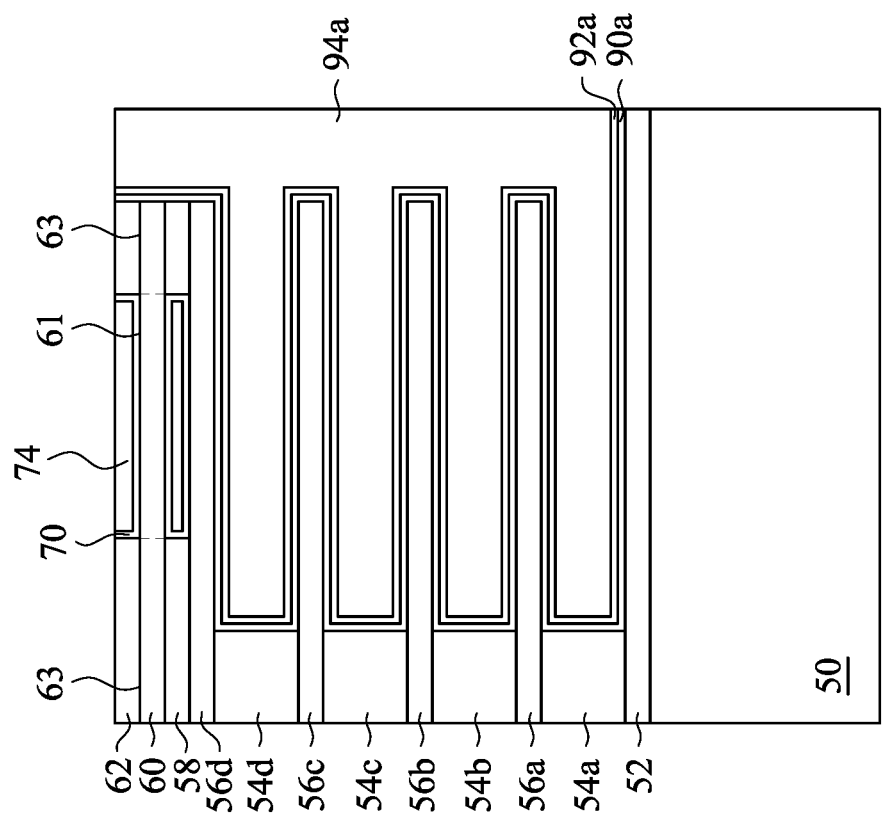

FIGS. 14A and 14B illustrate an embodiment in which multiple second dielectric layers 54a-54d and third dielectric layers 56a-56d are stacked between the first dielectric layer 52 and the fourth dielectric layer 58 to enlarge horizontal capacitors including the second metal layer 90, the fifth dielectric layer 92, and the third metal layer 94. The second dielectric layers 54a-54d may be formed of materials and by processes the same as or similar to those used for the second dielectric layers 54 and described above in reference to FIGS. 2A through 2D. The third dielectric layers 56a-56d may be formed of materials and by processes the same as or similar to those used for the third dielectric layers 56 and described above in reference to FIGS. 2A through 2D. The first metal layer 62, the semiconductor layer 60, the fourth dielectric layer 58, the third dielectric layers 56a-56d, and the second dielectric layers 54a-54d may be etched to form an opening using processes the same as or similar to those described above in reference to FIGS. 9A through 10D. Although FIGS. 14A and 14B illustrate four of the second dielectric layers 54a-54d and four of the third dielectric layers 56a-56d, any number of second dielectric layers 54 and the third dielectric layers 56 may be used.

Further in FIGS. 14A and 14B, a second metal layer 90a, a fifth dielectric layer 92a, and a third metal layer 94a are formed in the opening formed by etching the first metal layer 62, the semiconductor layer 60, the fourth dielectric layer 58, the third dielectric layers 56a-56d, and the second dielectric layers 54a-54d. The second metal layer 90a, the fifth dielectric layer 92a, and the third metal layer 94a may be formed of materials and by process the same as or similar to those used for the second metal layer 90, the fifth dielectric layer 92, and the third metal layer 94 and described above with respect to FIGS. 11A through 12D. As illustrated in FIG. 14A, the horizontal capacitor including the second metal layer 90a, the fifth dielectric layer 92a, and the third metal layer 94a may be comb-shaped in a cross-sectional view. Providing multiple second dielectric layers 54 and third dielectric layers 56 further increases the volume of a horizontal capacitor including the second metal layer 90a, the fifth dielectric layer 92a, and the third metal layer 94a without increasing the memory cell area. This improves read reliability and increases device performance, without increasing memory cell area or decreasing device density. Moreover, the above-described methods for forming horizontal capacitors and nano-FETs may be implemented in existing process flows for forming complementary metal oxide semiconductor (CMOS) devices, which reduces costs.

Figure 16:
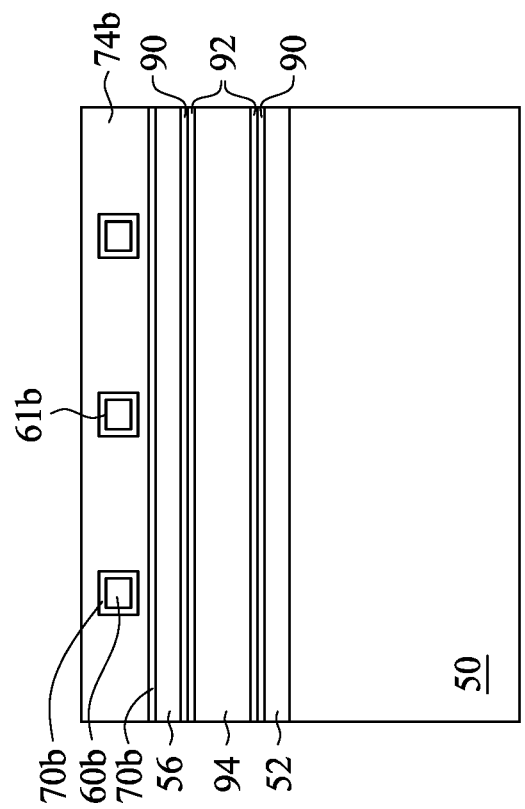
Figure 15:
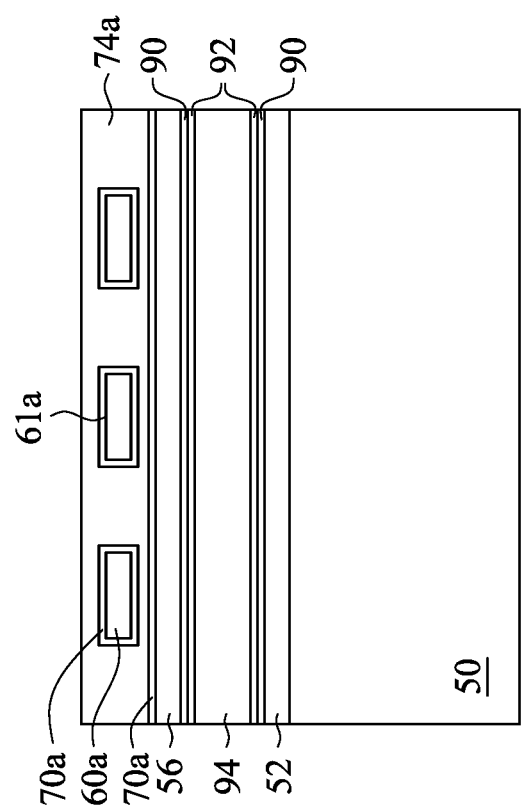
Figure 17:
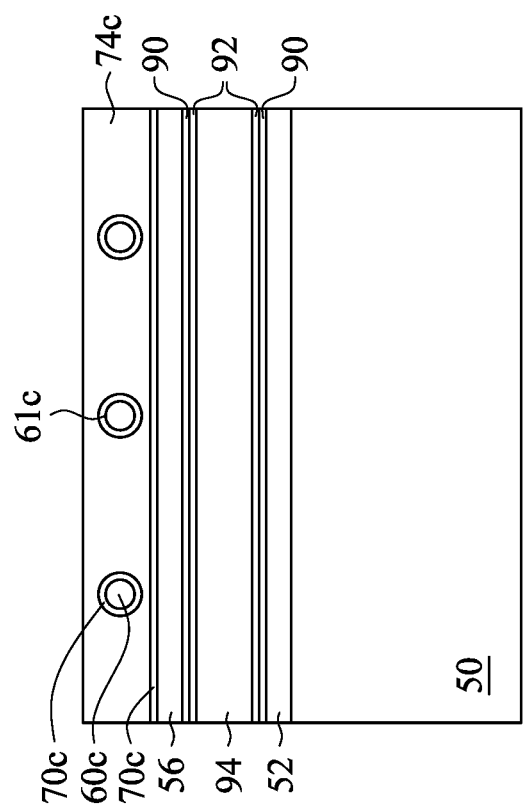

FIGS. 15 through 17 illustrate embodiments which include multiple nanostructures 61a-61c with varying cross-sectional shapes are formed in semiconductor layers 60a. The nanostructures 61a-61c, gate dielectric layers 70a-70c, and gate electrodes 74a-74c may be formed of materials and by process the same as or similar to those used for the nanostructure 61, the gate dielectric layers 70, and the gate electrode 74 and described above with respect to FIGS. 3A through 7D. In the embodiment illustrated in FIG. 15, the nanostructures 61a may have rectangular shapes in a cross-sectional view. In the embodiment illustrated in FIG. 16, the nanostructures 61b may have square shapes in a cross-sectional view. In the embodiment illustrated in FIG. 17, the nanostructures 61c may have round shapes, such as circular shapes, in a cross-sectional view. FIGS. 15 through 17 illustrate embodiments in which three nanostructures 61a-61c are formed for a nano-FET; however, any number of nanostructures 61a-61c may be formed for a nano-FET. The shape and number of nanostructures included in a nano-FET may be used to control the driving current for memory cell operation. Thus using various shapes and numbers of nanostructures allows for memory cells to be customizable for a variety of applications.

In accordance with an embodiment, a semiconductor device includes a channel structure over a semiconductor substrate; a gate structure encircling the channel structure; a first source/drain region adjacent the gate structure; and a capacitor adjacent the first source/drain region, the capacitor extending under the first source/drain region and the gate structure in a cross-sectional view. In an embodiment, the semiconductor device further includes a second source/drain region adjacent the gate structure, the second source/drain region being disposed on an opposite side of the gate structure from the first source/drain region, the capacitor extending under the second source/drain region in the cross-sectional view. In an embodiment, a bit line is coupled to the second source/drain region, a word line is coupled to the gate structure, and a source line is coupled to the capacitor. In an embodiment, the capacitor includes a first portion extending under the first source/drain region and the gate structure in the cross-sectional view and a second portion extending under the first source/drain region and the gate structure in the cross-sectional view, and a dielectric layer extends between the first portion and the second portion. In an embodiment, the capacitor is comb-shaped in the cross-sectional view. In an embodiment, the capacitor is L-shaped in the cross-sectional view. In an embodiment, top surfaces of the capacitor, the gate structure, and the first source/drain region are level with one another.

In accordance with another embodiment, a method includes depositing a multi-layer stack over a semiconductor substrate, the multi-layer stack including a first dielectric layer, a second dielectric layer, a third dielectric layer, a fourth dielectric layer, a first semiconductor layer, and a first metal layer; performing a first patterning process to pattern the first metal layer, the first semiconductor layer, and the fourth dielectric layer, the first patterning process forming a first opening surrounding a channel region of the first semiconductor layer; forming a gate structure in the first opening, the gate structure surrounding the channel region; performing a second patterning process to pattern the first metal layer, the first semiconductor layer, the fourth dielectric layer, the third dielectric layer, and the second dielectric layer the second patterning process forming a second opening exposing a first portion of the first dielectric layer, the second opening extending beneath the gate structure from a first side of the gate structure to a second side of the gate structure opposite the first side; and forming a capacitor in the second opening. In an embodiment, the first patterning process includes performing an anisotropic etching process on the first metal layer, the first semiconductor layer, and the fourth dielectric layer to expose the third dielectric layer and pattern the channel region in the first semiconductor layer; and performing an isotropic etching process to remove the first metal layer and the fourth dielectric layer from above and below the channel region, respectively, after performing the anisotropic etching process. In an embodiment, the second dielectric layer has a first width in a first direction perpendicular to a major surface of the semiconductor substrate before performing the second patterning process, the second dielectric layer has a second width in the first direction after performing the second patterning process, and a ratio of the second width to the first width is from 0.30 to 0.50. In an embodiment, forming the capacitor includes depositing a second metal layer in the second opening, the second metal layer contacting sidewalls of the first metal layer, the first semiconductor layer, the fourth dielectric layer, the third dielectric layer, and the second dielectric layer. In an embodiment, the method further includes depositing a fifth dielectric layer over the second metal layer; depositing a third metal layer over the second metal layer and filling the second opening; and planarizing top surfaces of the first metal layer, the gate structure, the second metal layer, the fifth dielectric layer, and the third metal layer. In an embodiment, the method further includes patterning the gate structure to form a third opening; and depositing an interlayer dielectric layer filling the third opening.

In accordance with yet another embodiment, a method includes forming a transistor over a semiconductor substrate, the transistor including a first source/drain region adjacent a gate structure and a second source/drain region adjacent the gate structure opposite the first source/drain region; performing a first anisotropic etching process on the first source/drain region to form a first opening; performing a first isotropic etching process through the first opening to pattern a dummy dielectric layer between the semiconductor substrate and the transistor, the first isotropic etching process extending the first opening; and forming a capacitor in the first opening. In an embodiment, forming the transistor includes patterning a semiconductor layer to form a plurality of channel regions extending in a plane parallel to a major surface of the semiconductor substrate; and forming the gate structure surrounding each channel region of the plurality of channel regions. In an embodiment, the method further includes planarizing the gate structure and a first metal layer over the first source/drain region and the second source/drain region. In an embodiment, the method further includes patterning the gate structure to remove first portions of the gate structure forming second openings after planarizing the gate structure and the first metal layer, a second portion of the gate structure remaining after patterning the gate structure; and forming an interlayer dielectric layer in the second openings. In an embodiment, the method further includes forming a first metal layer over the semiconductor layer, the first source/drain region and the second source/drain region being formed in portions of the first metal layer. In an embodiment, forming the capacitor includes conformally depositing a first metal layer in the first opening; conformally depositing a first dielectric layer over the first metal layer; conformally depositing a second metal layer over the first dielectric layer; and planarizing the first metal layer, the first dielectric layer, and the second metal layer. In an embodiment, the first metal layer is conformally deposited in contact with the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first transistor structure comprising:
a channel structure on a semiconductor substrate;
a gate structure on the channel structure;
a first source/drain region adjacent the gate structure; and
a second source/drain region adjacent the gate structure opposite the first source/drain region; and
a capacitor having a top surface level with a top surface of the gate structure, wherein the capacitor comprises an insulator layer between a first conductive layer and a second conductive layer, wherein the insulator layer of the capacitor extends under the first source/drain region and the second source/drain region in a first direction perpendicular to a major surface of the semiconductor substrate in a first cross-sectional view.

2. The semiconductor device of claim 1, wherein the first source/drain region is between the gate structure and the capacitor in a second direction parallel to the major surface of the semiconductor substrate in the first cross-sectional view.

3. The semiconductor device of claim 1, wherein the gate structure extends along a top surface and a bottom surface of the channel structure in the first cross-sectional view, and wherein the gate structure extends along the top surface, the bottom surface, and side surfaces of the channel structure in a second cross-sectional view perpendicular to the first cross-sectional view.

4. The semiconductor device of claim 1, wherein the capacitor comprises a first portion extending under the first source/drain region and the second source/drain region in the first direction perpendicular to the major surface of the semiconductor substrate, wherein the capacitor further comprises a second portion extending under the first source/drain region, the second source/drain region, and the first portion in the first direction perpendicular to the major surface of the semiconductor substrate, and wherein the second portion is separated from the first portion by a dielectric layer.

5. The semiconductor device of claim 1, further comprising a dielectric layer adjacent the capacitor in a second direction parallel to the major surface of the semiconductor substrate in the first cross-sectional view, wherein the dielectric layer extends under the second source/drain region in the first direction perpendicular to the major surface of the semiconductor substrate.

6. The semiconductor device of claim 1, further comprising an interlayer dielectric adjacent the gate structure, wherein a top surface of the interlayer dielectric is level with the top surface of the capacitor and the top surface of the gate structure.

7. The semiconductor device of claim 1, further comprising:
a dielectric layer between the gate structure and the capacitor in the first direction; and
an isolation layer between the dielectric layer and each of the first source/drain region and the second source/drain region in the first direction.

8. A semiconductor device comprising:
a multi-layer stack over a semiconductor substrate, the multi-layer stack comprising a first dielectric layer, a second dielectric layer, a third dielectric layer, a fourth dielectric layer, a first semiconductor layer, and a first metal layer, wherein the first semiconductor layer comprises a channel region, a first source/drain region, and a second source/drain region;
a gate structure on the channel region; and
a capacitor in contact with the first dielectric layer, the second dielectric layer, the third dielectric layer, the fourth dielectric layer, the first semiconductor layer, and the first metal layer, wherein the capacitor extends beneath the gate structure from a first side of the gate structure to a second side of the gate structure opposite the first side.

9. The semiconductor device of claim 8, wherein the gate structure extends between the third dielectric layer and the channel region of the first semiconductor layer.

10. The semiconductor device of claim 8, wherein the gate structure is in contact with the fourth dielectric layer and the first metal layer.

11. The semiconductor device of claim 8, wherein a top surface of the first metal layer, a top surface of the gate structure, and a top surface of the capacitor are level with one another.

12. The semiconductor device of claim 8, wherein the gate structure is in contact with a top surface, a side surface, and a bottom surface of the channel region of the first semiconductor layer.

13. The semiconductor device of claim 8, further comprising an interlayer dielectric in contact with the gate structure, wherein a top surface of the interlayer dielectric is level with a top surface of the gate structure.

14. A semiconductor device comprising:
   a transistor over a semiconductor substrate, the transistor comprising a first source/drain region adjacent a gate structure and a second source/drain region adjacent the gate structure opposite the first source/drain region; and
   a capacitor adjacent the transistor, the capacitor having a top surface level with a top surface of the transistor in a cross-sectional view, wherein the capacitor comprises an insulator layer between a first conductive layer and a second conductive layer, wherein the insulator layer, the first conductive layer, and the second conductive layer of the capacitor extend under the gate structure and at least one of the first source/drain region or the second source/drain region in the cross-sectional view.

15. The semiconductor device of claim 14, wherein the capacitor contacts the second source/drain region.

16. The semiconductor device of claim 14, wherein the capacitor extends under the first source/drain region and the second source/drain region in the cross-sectional view.

17. The semiconductor device of claim 14, wherein the gate structure comprises a gate dielectric layer, a gate electrode material on the gate dielectric layer, and a gate cap layer on the gate electrode material, wherein a top surface of the gate cap layer is level with the top surface of the capacitor.

18. The semiconductor device of claim 17, further comprising:
   an interlayer dielectric on the transistor and the capacitor; and
   a gate contact extending through the interlayer dielectric and the gate cap layer to contact the gate electrode material.

19. The semiconductor device of claim 14, further comprising:
   an interlayer dielectric on the transistor and the capacitor;
   a gate contact extending through the interlayer dielectric to contact the gate structure; and
   a capacitor contact extending through the interlayer dielectric to contact the capacitor, wherein the gate contact has a first height greater than a second height of the capacitor contact.

20. The semiconductor device of claim 14, wherein the capacitor comprises:
   a first portion extending under the gate structure and at least one of the first source/drain region or the second source/drain region in the cross-sectional view; and
   a second portion extending under the gate structure and at least one of the first source/drain region or the second source/drain region in the cross-sectional view, wherein the second portion is at least partially separated from the first portion by a dielectric layer.

* * * * *